(12) United States Patent
Kim et al.

(10) Patent No.: US 7,561,215 B2
(45) Date of Patent: Jul. 14, 2009

(54) METHOD AND APPARATUS FOR WIRELESSLY CONTROLLING DEVICES PERIPHERAL TO AV DEVICE

(75) Inventors: Jae-kwon Kim, Suwon-si (KR); Hyo-dae Kim, Suwon-si (KR); Jong-wook Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 593 days.

(21) Appl. No.: 11/024,810

(22) Filed: Dec. 30, 2004

(65) Prior Publication Data

US 2005/0166241 A1    Jul. 28, 2005

(30) Foreign Application Priority Data

Jan. 6, 2004    (KR) ...................... 10-2004-0000733

(51) Int. Cl.
*H04N 5/44* (2006.01)
*H04N 7/16* (2006.01)

(52) U.S. Cl. .............................. 348/734; 725/81; 725/80

(58) Field of Classification Search ................. 348/734, 348/553, 552, 723, 705, 706; 340/825.25, 340/825.69; 370/315; 725/81, 78, 90, 91, 725/93, 114, 116, 117, 74, 80, 82
See application file for complete search history.

(56) References Cited

U.S. PATENT DOCUMENTS 6,263,503 B1 *   7/2001   Margulis ...................... 725/81
6,292,283 B1 *   9/2001   Grandbois .................. 398/107
6,400,280 B1 *   6/2002   Osakabe ................. 340/825.25
2006/0098592 A1 *   5/2006   Proctor, Jr. et al. .......... 370/315

FOREIGN PATENT DOCUMENTS

| JP | 6-245265 A | 9/1994 |
|---|---|---|
| JP | 11-113075 A | 4/1999 |
| JP | 2001-36976 A | 2/2001 |
| JP | 2003-18662 A | 1/2003 |

* cited by examiner

*Primary Examiner*—M. Lee
(74) *Attorney, Agent, or Firm*—Sughrue Mion, PLLC

(57) ABSTRACT

Apparatus and method which integrates and automates AV system to control peripheral devices with one remote control including wireless bridge connected to peripheral devices through a network and a host device which receives a remote control input of a user, transmits a control signal to wireless bridge wirelessly, receives a video and an audio from the wireless bridge wirelessly, and displays received video and audio to user. A video device includes a wireless bridge transmitting a control signal for controlling a peripheral device to the peripheral device through a communication cable, receiving a response signal for the control signal from the peripheral device and receiving an AV signal from the peripheral device through an AV cable according to the control signal, and a host device for wirelessly receiving the inputted AV signal from the wireless bridge and displaying a video or an audio restored from the AV signal to user.

15 Claims, 29 Drawing Sheets

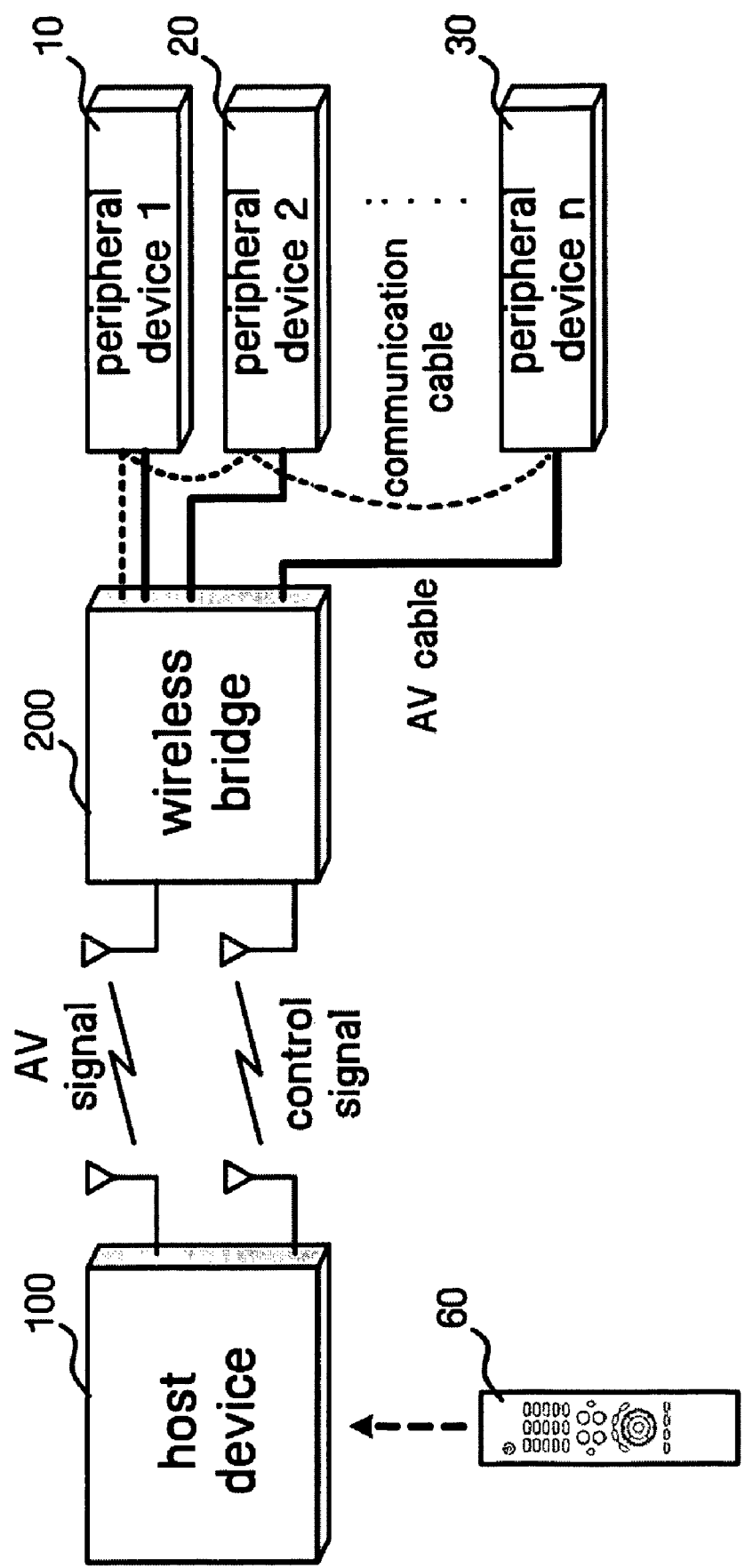

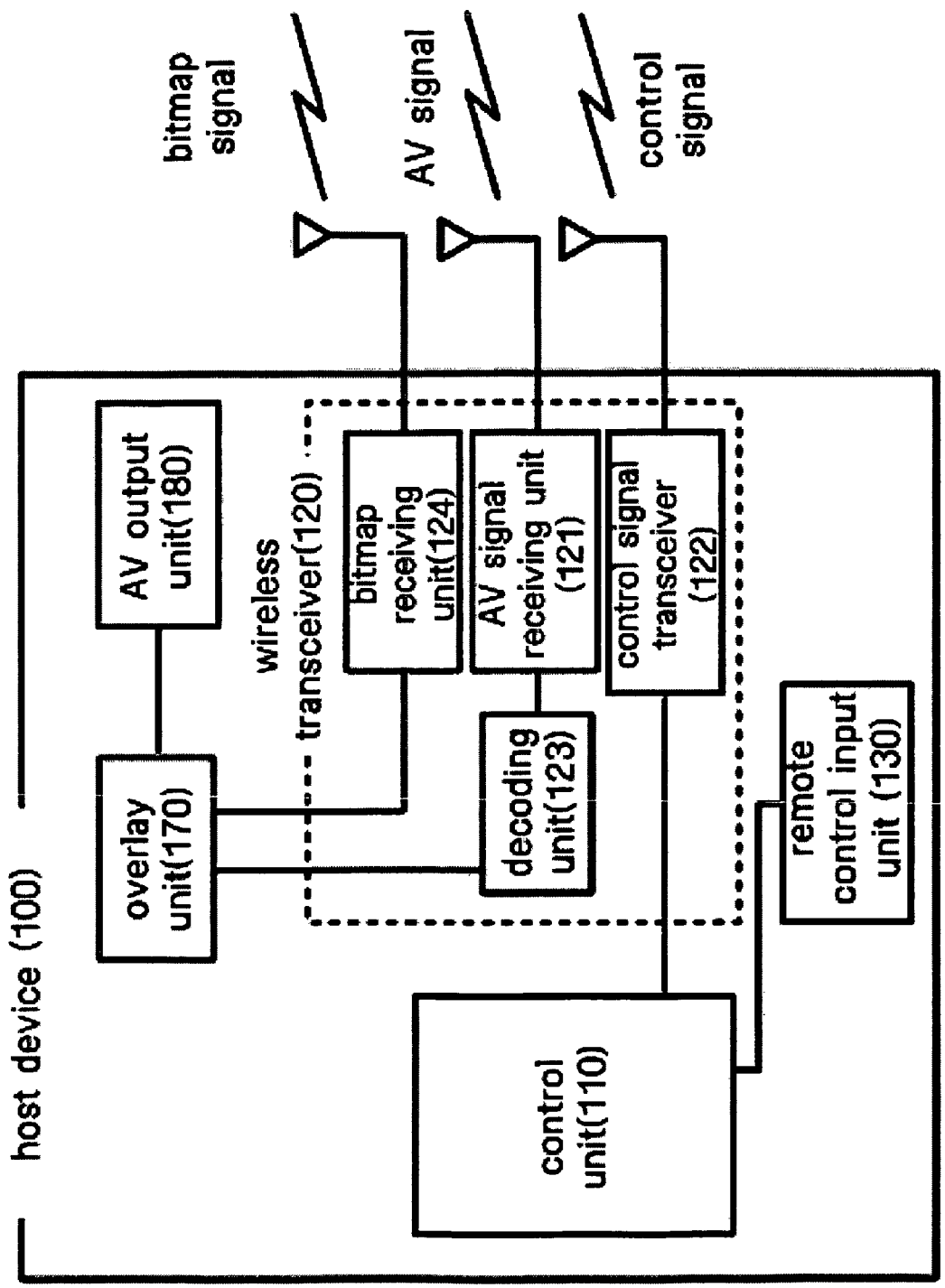

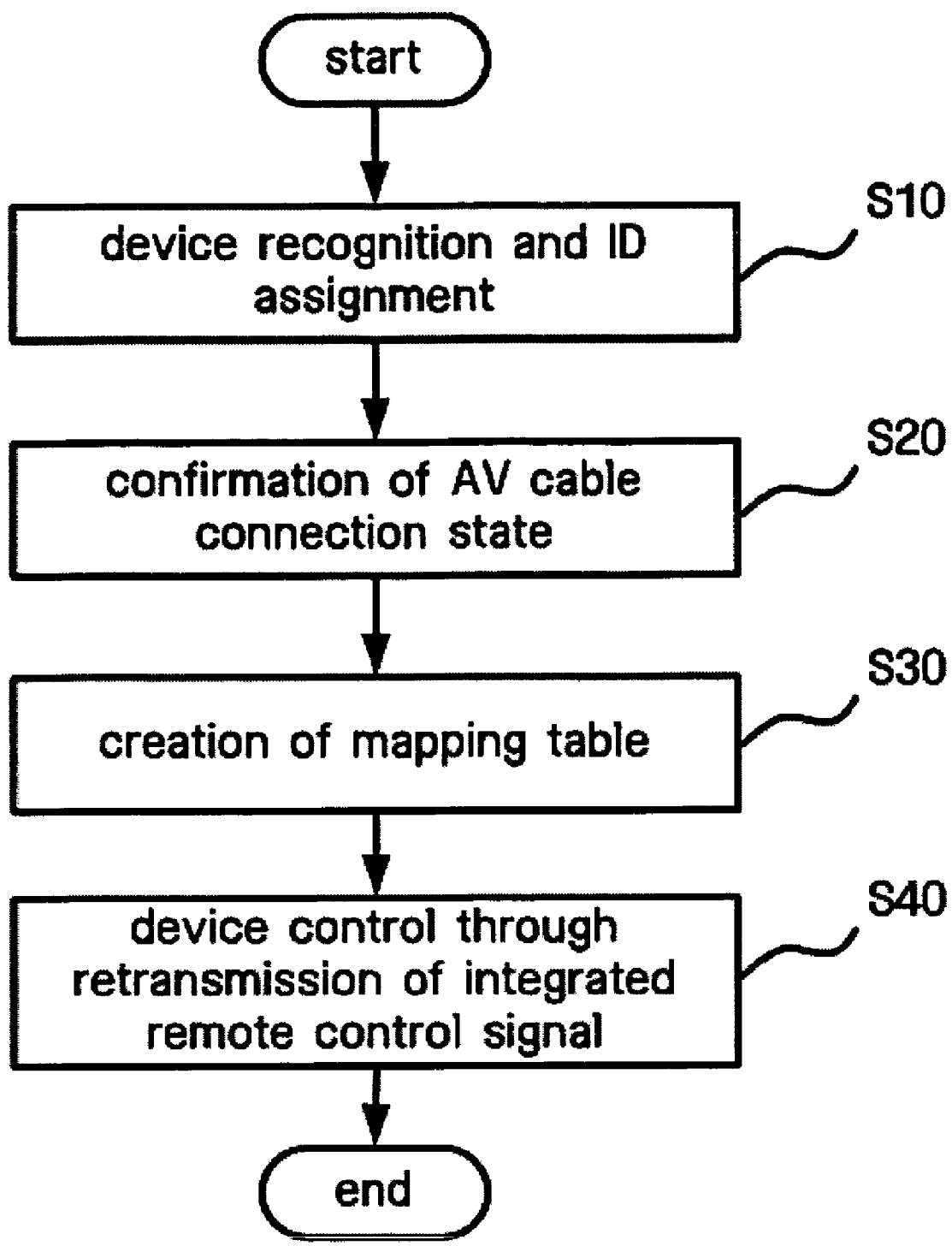

FIG. 11C

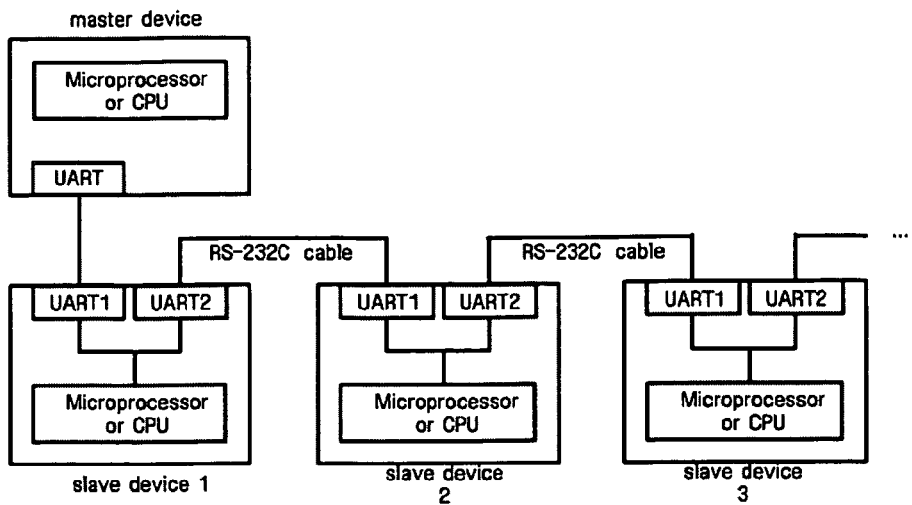

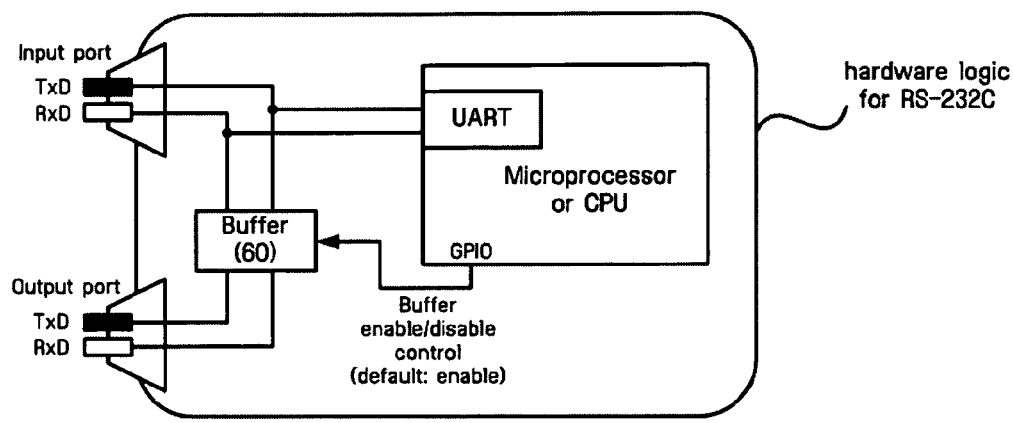

```
DescoveryAddressDevice()
{
  MessageFromDevice=TRUE;
  Broadcast to all device to disable the control buffer and clear all device ID
  While(MessageFromDevice==FALSE)do
  {
          Send WhoAreYou Packet to device         (A)
          if(Receive WhoIAm Packet)           (B)
          {
                  Generate new device ID and send it to device
                  Register the device ID
                  (The device will enable the buffer)
          }
          else
          {
                  MessageFromDevice=FALSE
          }
  }
}
```

FIG. 13

```
UpdateDeviceStatus()
{
    for(id=id_start id < id_end; id++)
    {
        //query device status and store the return value
        DeviceStatus = QueryDeviceStatus(id);
        //IF there is no return value, DeviceStatus is NULL
        If(DeviceStatus == NULL)
        {
            remove the device ID
        }
        else
        {
            //update the device status information
            Device[id].Status = DeviceStatus;
        }
    }
}
```

```
PlugDetection()
{
  For all slaves S
  {
      send MSG_GET_PULG_TYPE ot S
      Receive response message from S
  }

For all source or combo devices S
  {
      For all source or combo devices T except S
      {
          Send MSG_SIG_OFF to T;
      }

Send MSG_SIG_ON to S;
      For all sink or combo devices U except S
      {
          Send MSG_DETECT_SIG_INPUT to U;
          Received response message from U
      }
  }
}
```

FIG. 16A

| Key code | Control command according to device state | Device to be controlled |
|---|---|---|
| Power supply | POWER | Combo retransmission |
| When key is inputted continuously | COMBOR_POWER, AVR_POWER, STBR_POWER, POWER | 1. Combo AVR STB retransmission 2. TV UI |
| DTV+ | Not supported in this mode | Return |
| Preference channel | Not supported in this mode | Return |
| Device selection | Not supported in this mode | Return |
| Number (when TV OSD is OFF) | COMBOR_NUM_NUM0 | Combo retransmission |
| | COMBOR_NUM_NUM1 | Combo retransmission |
| | COMBOR_NUM_NUM2 | Combo retransmission |
| | COMBOR_NUM_NUM3 | Combo retransmission |
| | COMBOR_NUM_NUM4 | Combo retransmission |
| | COMBOR_NUM_NUM5 | Combo retransmission |
| | COMBOR_NUM_NUM6 | Combo retransmission |
| | COMBOR_NUM_NUM7 | Combo retransmission |
| | COMBOR_NUM_NUM8 | Combo retransmission |
| | COMBOR_NUM_NUM9 | Combo retransmission |
| Number (when TV OSD is ON) | NUM0 | TV UI |
| | NUM1 | TV UI |
| | NUM2 | TV UI |
| | NUM3 | TV UI |
| | NUM4 | TV UI |
| | NUM5 | TV UI |
| | NUM6 | TV UI |
| | NUM7 | TV UI |
| | NUM8 | TV UI |
| | NUM9 | TV UI |
| Mute | MUTE | TV UI |
| | AVRCR_AUDIO_MUTE | AVR retransmission |
| Volume (same as when continous key is inputted) | VOL_UP(when listening with TV set) | TV UI |
| | VOL_UP(when listening with TV set) | TV UI |
| | AVRCR_VOLUME_UP | AVR retransmission |
| | AVRCR_VOLUME_DOWN | AVR retransmission |
| When channel TV OSD is OFF | COMBOR_CHANNEL_UP | Combo retransmission |
| | COMBOR_CHANNEL_DOWN | Combo retransmission |
| When channel TV OSD is ON | CH_UP | TV UI |
| | CH_DOWN | TV UI |
| TV / external input | TV_VIDEO | TV UI |
| Menu | COMBOR_DISC_MENU | Combo retransmission |
| Broadcating information | Not supported in this mode | Return |
| Information display | COMBOR_INFO_DISPLAY | Combo retransmission |
| End | COMBOR_RETURN | Combo retransmission |
| End (when OSD menu is ON) | EXIT | TV UI |
| Four directions / selection (same as when continous key is inputted) | COMBOR_CURSOR_UP | Combo retransmission |
| | COMBOR_CURSOR_DOWN | Combo retransmission |
| | COMBOR_CURSOR_RIGHT | Combo retransmission |
| | COMBOR_CURSOR_LEFT | Combo retransmission |
| | COMBOR_ENTER | Combo retransmission |
| Four directions / selection (When TV OSD menu is ON) | CURSOR_UP | TV UI |
| | CURSOR_DOWN | TV UI |
| | CURSOR_RIGHT | TV UI |
| | CURSOR_LEFT | TV UI |
| | ENTER | TV UI |
| Screen mode | PSM | TV UI |
| Still screen | STILL_PIC | TV UI |
| Screen size | ARC | TV UI |
| Surround | DOLBY | TV UI |
| Automatic channel | Not supported in this mode | Return |
| Memory / delete | Not supported in this mode | Return |
| Multi-sound | Not supported in this mode | Return |
| Replay function | COMBOR_BACK_REW | Combo retransmission |
| | COMBOR_STOP | Combo retransmission |
| | COMBOR_PLAY_PAUSE | Combo retransmission |
| | COMBOR_FOR_FF | Combo retransmission |

FIG. 16B

| Key code | Control command according to device state | Device to be controlled |
|---|---|---|
| Power supply | POWER | STB retransmission |
| When key is inputted continously | COMBOR_POWER, AVR_POWER, STBR_POWER, POWER | 1. Combo AVR STB retransmission<br>2. TV UI |
| Preference channel | Not supported in this mode | Return |
| Device selection | Not supported in this mode | Return |
| Number | STBR_NUM_0 | STB retransmission |
| | STBR_NUM_1 | STB retransmission |
| | STBR_NUM_2 | STB retransmission |
| | STBR_NUM_3 | STB retransmission |
| | STBR_NUM_4 | STB retransmission |
| | STBR_NUM_5 | STB retransmission |
| | STBR_NUM_6 | STB retransmission |
| | STBR_NUM_7 | STB retransmission |
| | STBR_NUM_8 | STB retransmission |
| | STBR_NUM_9 | STB retransmission |
| Mute | MUTE | TV UI |
| | AVRCR_AUDIO_MUTE | AVR retransmission |
| Volume (same as when continous key is inputted) | VOL_UP (when listening with TV set) | TV UI |
| | VOL_UP (when listening with TV set) | TV UI |
| | AVRCR_VOLUME_UP | AVR retransmission |
| | AVRCR_VOLUME_DOWN | AVR retransmission |
| channel | STBR_CHANNEL_UP | STB retransmission |
| | STBR_CHANNEL_DOWN | STB retransmission |
| TV / external input | Not supported in this mode | Return |
| Menu | STBR_MENU | STB retransmission |
| Broadcating information | Not supported in this mode | Return |
| Information display | STBR_INFO_DISPLAY | STB retransmission |
| End | Not supported in this mode | Return |
| End (when OSD menu is ON) | EXIT | TV UI |
| Four directions / selection (same as when continous key is inputted) | STBR_CURSOR_UP | STB retransmission |
| | STBR_CURSOR_DOWN | STB retransmission |
| | STBR_CURSOR_RIGHT | STB retransmission |
| | STBR_CURSOR_LEFT | STB retransmission |
| | STBR_ENTER | STB retransmission |
| Four directions / selection (When TV OSD menu is ON) | CURSOR_UP | TV UI |
| | CURSOR_DOWN | TV UI |
| | CURSOR_RIGHT | TV UI |
| | CURSOR_LEFT | TV UI |
| | ENTER | TV UI |
| Screen mode | PSM (when OSD menu is ON) | TV UI |
| Still screen | STILL_PIC (when OSD menu is ON) | TV UI |
| Screen size | ARC (when OSD menu is ON) | TV UI |
| Surround | DOLBY (when OSD menu is ON) | TV UI |
| Automatic channel | Not supported in this mode | Return |
| Memory / delete | Not supported in this mode | Return |
| Multi-sound | Not supported in this mode | Return |
| Replay function | Not supported in this mode | Return |
| | Not supported in this mode | Return |
| | Not supported in this mode | Return |
| | Not supported in this mode | Return |

METHOD AND APPARATUS FOR WIRELESSLY CONTROLLING DEVICES PERIPHERAL TO AV DEVICE

CROSS-REFERENCE TO RELATED APPLICATION

This application claims the priority of Korean Patent Application No. 10-2004-0000733 filed on Jan. 6, 2004, in the Korean Intellectual Property Office, the disclosure of which is incorporated herein in its entirety by reference.

BACKGROUND OF THE INVENTION

1. Field of the Invention

The present invention relates to a method for controlling a plurality of peripheral devices with one remote control, and more particularly, to an apparatus and method which integrates and automates an AV system so as to control a plurality of peripheral devices with one remote control in the AV system including a wireless bridge connected to the peripheral devices through communication cables in a network and a host device which receives a remote control input of a user, transmits a control signal to the wireless bridge wirelessly, receives a video and audio from the wireless bridge wirelessly, and displays the received video and audio to the user.

2. Description of the Related Art

In order to set a series of operations such as a digital video disc (hereinafter, referred to as a DVD) view, a satellite broadcasting view, a video cassette recorder (VCR) view, etc., two conventional methods as follows have been employed. One of the two methods is shown in FIG. 1, in which a user controls corresponding devices by using corresponding remote controls for a television (hereinafter, referred to as a TV) 50 and audio/video (hereinafter, referred to as an AV) devices 10, 20, and 30. The other of the two methods is shown in FIG. 2, in which a user can use an integrated remote control in switching the input mode of the TV 50 from a TV input mode to a corresponding mode of input from one of the AV devices 10, 20 and 30, displaying a settings menu corresponding to the corresponding AV device, and setting conditions for a series of operations of each AV device.

In an AV system having the construction as shown in FIG. 1, when a user wants to see a DVD, a user properly sets an external input by using a TV remote control and then controls the playback of the DVD by using a DVD player remote control. Further, in an AV system having the construction as shown in FIG. 2, one integrated remote control is used. The integrated remote control is simply one remote control and is an integration of multiple remote controls into one remote device. Further, in order to control a specific appliance, a user switches the current mode into a specific appliance mode and then sends a command for the specific appliance by using the integrated remote control.

The conventional methods have the following problems. First, it is inconvenient for a user to individually set the operation of each AV device by using a corresponding remote control in order to set a series of operations. Further, even in the case as shown in FIG. 2, there is the advantage in that a user controls multiple AV devices with one integrated remote control, but the user is still inconvenienced by having to individually set the operation of each AV device in order to set a series of operations.

Secondly, it is inconvenient for a user to individually perform the work of setting devices by means of a corresponding remote control (by switching to a corresponding mode of an integrated remote control) whenever the user changes a setting for another operation.

Thirdly, since a basic knowledge about each device is necessary in setting each AV device, there is no guarantee that a setting is correctly performed when an automatic setting is performed by means of a macro function because the AV device may be incorrectly connected to a TV. That is, since a control signal is unilaterally transmitted from the TV to corresponding AV devices, a designated operation is dynamically performed according to connection states of the AV devices.

Fourthly, since the TV and the AV devices are connected to each other through wired AV cables, it is difficult to dispose the TV at random locations or locations far from the AV devices. That is, there is a limitation in that the TV must be installed at locations where the AV cables can reach.

SUMMARY OF THE INVENTION

Accordingly, the present invention has been made to solve the above-mentioned problems occurring in the prior art, and it is an aspect of the present invention to provide an apparatus and a method which enable a host device to automatically control a series of operations for AV devices wirelessly, thereby solving the problems in the conventional system in that a setting must be performed for each AV device and the host device has a limitation in where it can be installed.

It is another aspect of the present invention to provide an apparatus and a method which can solve the problem of limited installation for a host device by employing a wireless apparatus and method, so that the host device can be installed at any place in a house and can control the AV devices regardless of the location of the AV devices, and especially so that multiple wireless host devices can be installed at various locations, can simultaneously receive AV signals, and can control the AV devices.

In order to achieve the above aspects, according to one aspect of the present invention, there is provided a wired/wireless control signal transmission/reception apparatus comprising: a wireless control signal transceiver for receiving a wireless control signal for controlling a predetermined peripheral device and transmitting a wireless response signal for the control signal received from the peripheral device; a control signal generating unit for generating a wired control signal corresponding to the wireless control signal received in the wireless control signal transceiver and generating a wireless response signal corresponding to a wired response signal received from an AV device; and a control signal transceiver for transmitting wired control signal information generated by the control signal generating unit to the peripheral device and receiving the wired response signal received from an AV device.

In order to achieve the above aspects, according to one aspect of the present invention, there is provided a video device comprising: a wireless bridge for transmitting a control signal for controlling a peripheral device to the peripheral device through a communication cable, receiving a response signal for the control signal from the peripheral device and receiving an AV signal from the peripheral device through an AV cable according to the control signal; and a host device for wirelessly receiving the inputted AV signal from the wireless bridge and displaying a video and/or audio restored from the AV signal to a user.

In order to achieve the above aspects, according to one aspect of the present invention, there is provided a method for controlling devices peripheral to an AV device comprising the steps of: a) detecting peripheral devices existing on a network connected through a communication cable and allocating a device identification ID to each peripheral device; b) checking connection states of the peripheral devices by means of the assigned IDs; and c) receiving a remote control key code from a user through an integrated remote control, generating control signals for controlling the peripheral devices, and transmitting the generated control signals to the peripheral devices.

BRIEF DESCRIPTION OF THE DRAWINGS

The above and other aspects, features and advantages of the present invention will be more apparent from the following detailed description taken in conjunction with the accompanying drawings, in which:

FIG. 3 is a block diagram illustrating a method for controlling peripheral devices through an integrated remote control according to the present invention;

FIG. 6A is a block diagram showing a construction of a host device according to a third embodiment of the present invention;

FIG. 10 is a flowchart schematically illustrating an entire operation of the present invention;

FIG. 11C is a block diagram showing a case in which a video device and peripheral devices are connected through a daisy-chain method by means of a RS-232C cable;

FIG. 13 is a view showing an algorithm for checking whether or not a peripheral device on a network is deleted in a method of automatically allocating an ID to a peripheral device;

FIG. 16A is a view showing a mapping table when an external input device is a DVD combo;

FIG. 16B is a view showing a mapping table when an external input device is a STB;

DETAILED DESCRIPTION OF THE EXEMPLARY EMBODIMENTS

Figure 1:
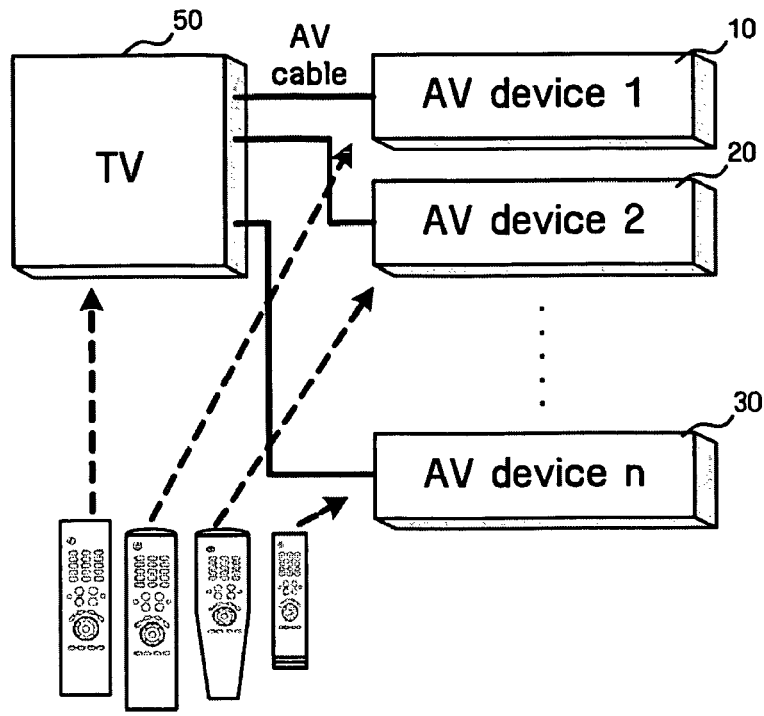
FIG. 1 is a view showing a method by which a user controls a corresponding device by using a corresponding remote control according to each device.
Figure 2:
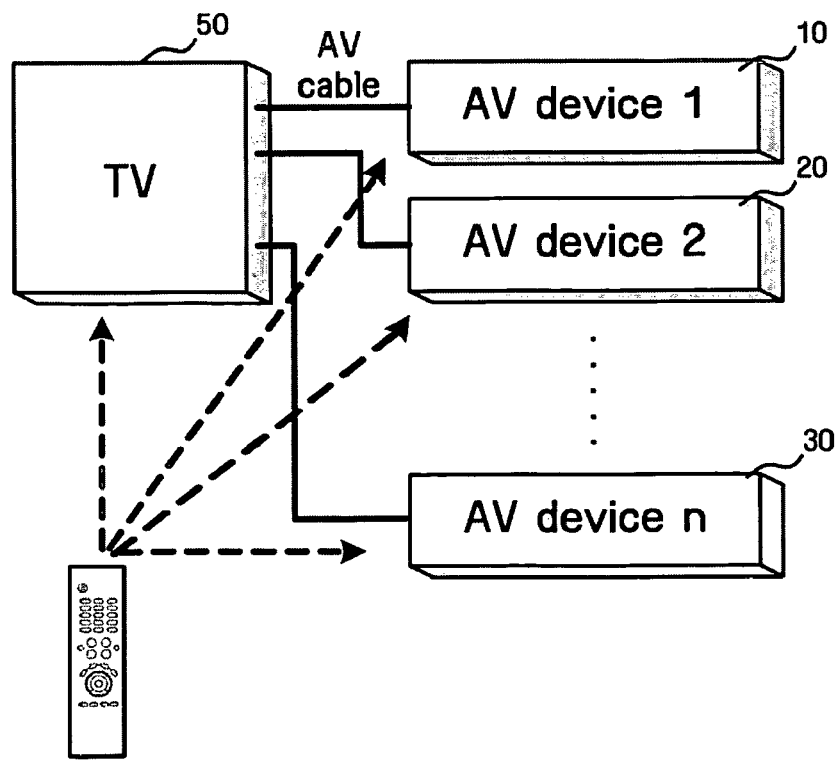
FIG. 2 is a view showing a method by which a user controls multiple devices with one integrated remote control.

Hereinafter, embodiments of the present invention will be described in detail with reference to the accompanying drawings.

Advantages and features of the present invention, and methods for achieving them will be apparent to those skilled in the art from the detailed description of the embodiments together with the accompanying drawings. However, the scope of the present invention is not limited to the embodiments disclosed in the specification and the present invention can be realized in various types. The described present embodiments are presented only for disclosing the present invention and helping those skilled in the art to completely understand the scope of the present invention, and the present invention is defined by the scope of the claims. Additionally, the same reference numerals are used to designate the same elements throughout the specification and drawings.

FIG. 3 is a block diagram illustrating a method for controlling peripheral devices through an integrated remote control according to the present invention. FIG. 3 shows not only AV cables (drawn by thick lines) for transmitting/receiving a video signal and/or an audio signal but also communication cables (drawn by a dotted line), such as the IEEE 1394 cable, a RS-232C cable, etc., using a separate protocol in order to transmit a data packet. The AV cables and the communication cables connect a wireless bridge 200 to peripheral devices 10 to 30. Further, the wireless bridge 200 can exchange an AV signal and a control signal with a host device 100 through a wireless medium.

When a user inputs the key code of a remote control 60 to the host device 100 by using one integrated remote control 60, the host device 100 sends a control signal according to the key code to the wireless bridge 200 and the wireless bridge 200 sends the control signal to peripheral devices through the communication cable according to the control signal. Then, the peripheral devices having received the control signal perform corresponding operations and input video signals and/or audio signals to the wireless bridge 200 through the AV cables or the communication cable. The wireless bridge 200 generates an AV signal having a predetermined packet structure from the inputted video signal and/or the audio signal and transmits the generated AV signal to the host device 100 through a wireless medium. Then, the host device 100 restores a video and/or audio from the inputted AV signal and outputs the restored image and/or voice through an AV output unit.

Hereinafter, the present invention includes first, second, and third embodiments according to structures and functions of the host device 100 and the wireless bridge 200. In the first embodiment, the host device 100 generates a control signal for controlling a control signal for controlling a peripheral device and the wireless bridge 200 simply sends the generated control signal. In the second and the third embodiments, the host device 100 simply retransmits a key code of a remote control to the wireless bridge 200 and the wireless bridge 200 generates a control signal. In the second embodiment, the host device 100 and the wireless bridge 200 manage on screen displays, (hereinafter, referred to as an OSD) respectively. In the third embodiment, the wireless bridge 200 manages an OSD and transmits only an OSD bitmap image to the host device 100.

In the present invention, the host device 100 may be an apparatus (e.g., TV, PDP) capable of outputting an image or a video and audio and a peripheral device may be an AV device such as an AV receiver, a DVD player, a DVD recorder, a DVD combo, a VCR, a cable set-top box, a satellite set-top box, a terrestrial set-top box, etc.

Hereinafter, it is important to distinguish the host device 100 and the wireless bridge 200, but the host device 100 and the wireless bridge 200 may be referred to generally as a video device 400 with respect to a peripheral device 300.

Figure 4A:
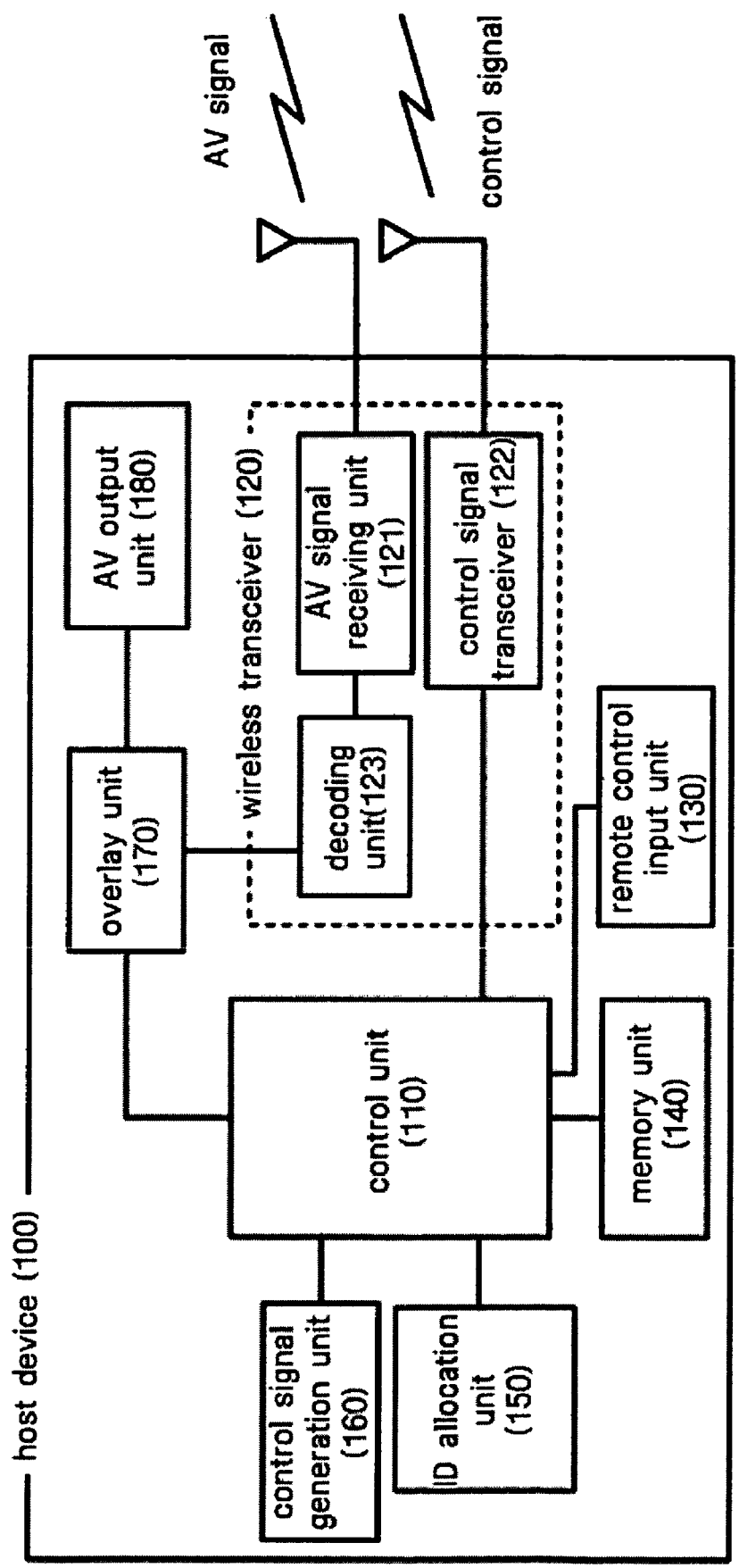
FIG. 4A is a block diagram showing a construction of a host device according to a first embodiment of the present invention.
Figure 4B:
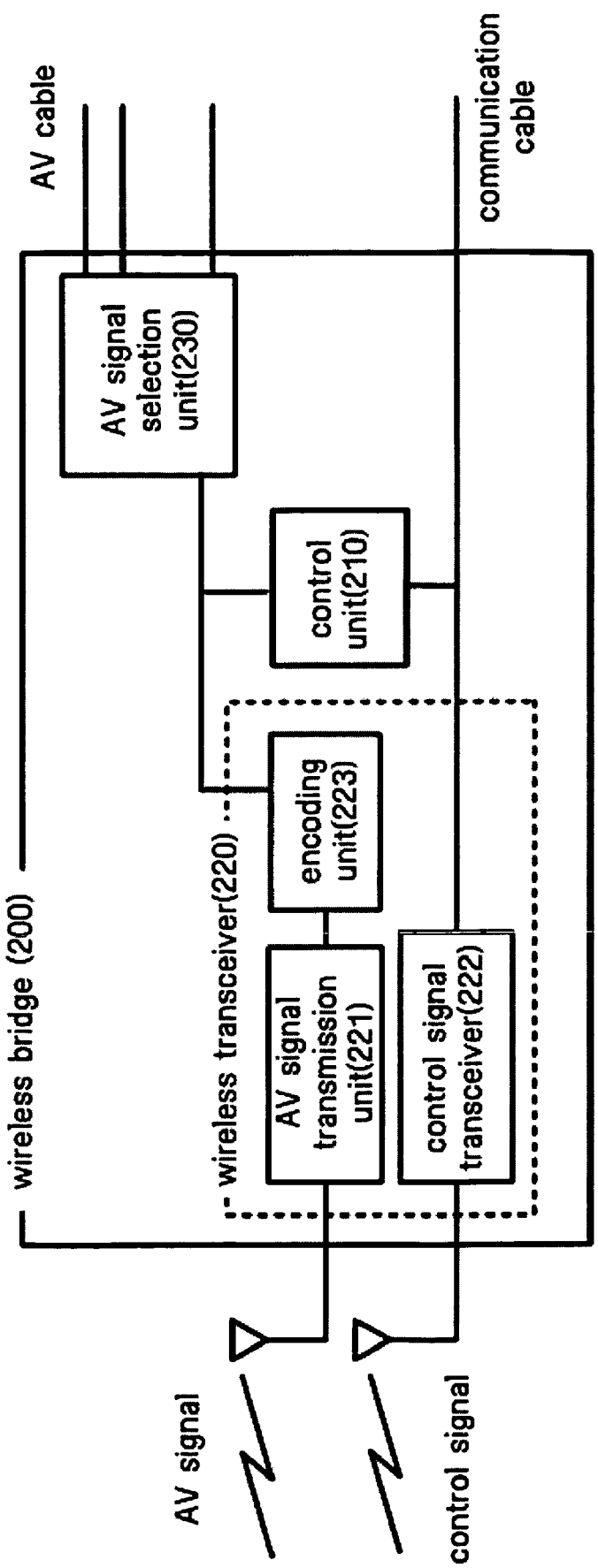
FIG. 4B is a block diagram showing a construction of a wireless bridge according to a first embodiment of the present invention.

FIGS. 4A and 4B are block diagrams showing constructions of the host device 100 and the wireless bridge 200 according to the first embodiment of the present invention. The host device 100 may include a control unit 110, a wireless transceiver 120, a remote control input unit 130, a memory unit 140, an ID allocation unit 150, a control signal generation unit 160, an overlay unit 170 and an AV output unit 180. The wireless transceiver 120 may include an AV signal receiving unit 121, a control signal transceiver 122 and a decoding unit 123.

Herein, the control signal transceiver 122 transmits a control signal generated by the control signal generation unit 160 and receives a control signal from the wireless bridge 200. The AV signal reception unit 121 receives an AV signal from the wireless bridge 200 and the decoding unit 123 decodes the AV signal to restore a video and audio.

The remote control input unit 130 receives a key code value inputted by a user. Further, the memory unit 140 stores device identification IDs allocated to peripheral devices, connection state information representing connection states between the wireless bridge 200 and the peripheral devices and bitmap information for outputting an OSD to an image.

The ID allocation unit 150 generates IDs for allocating the device identification IDs to the peripheral devices. For the generation of the IDs, the ID allocation unit 150 must confirm whether the device identification IDs already stored in the memory unit 140 exist or not and prevent IDs to be newly allocated from overlapping with the existing IDs.

The control signal generation unit 160 generates a control command packet such as a "WhoAreYou" packet for allocating the device identification IDs to the peripheral devices, a packet requesting state information of a device and a packet controlling an ON/OFF state of a device.

The overlay unit 170 overlays the bitmap information for OSD stored in the memory unit 140 on the image restored through the decoding unit 123.

The AV output unit 180 displays the image overlaid by the overlay unit 170 and outputs voice outputted from the decoding unit 123 through a speaker, etc., when outputting voice.

Further, the control unit 110 plays a role of controlling an operation of each unit.

Meanwhile, the wireless bridge 200 wirelessly communicating with the host device 100 may include a control unit 210, a wireless transceiver 220, and an AV signal selection unit 230.

The wireless transceiver 220 may include a control signal transceiver 222, an AV signal transmission unit 221, and an encoding unit 223. First, the control signal transceiver 222 receives the control signal, which is transmitted from the host device 100, through a wireless medium, transmits the received control signal to the peripheral device through the communication cable and transmits a control signal sent from the peripheral device to the host device 100. Next, the AV signal transmission unit 221 receives an AV signal encoded by the encoding unit 223 to transmit the received AV signal to the host device 100. Lastly, the encoding unit 223 passes a digital video and/or audio signal, which is received through the AV signal selection unit 230, and encodes an analog video and/or audio signal received through the AV signal selection unit 230 by a predetermined compression method. Herein, the encoding may employ an example in which the signal is encoded into a transport stream conforming to the MPEG 2 standard. However, the scope of the present invention is not limited to the example and another video or audio compression method may be employed.

The AV signal selection unit 230 determines a peripheral device outputting a video and/or audio received through the AV cable according to a control signal. Further, the control unit 210 plays a role of controlling an operation of each unit.

Figure 5A:
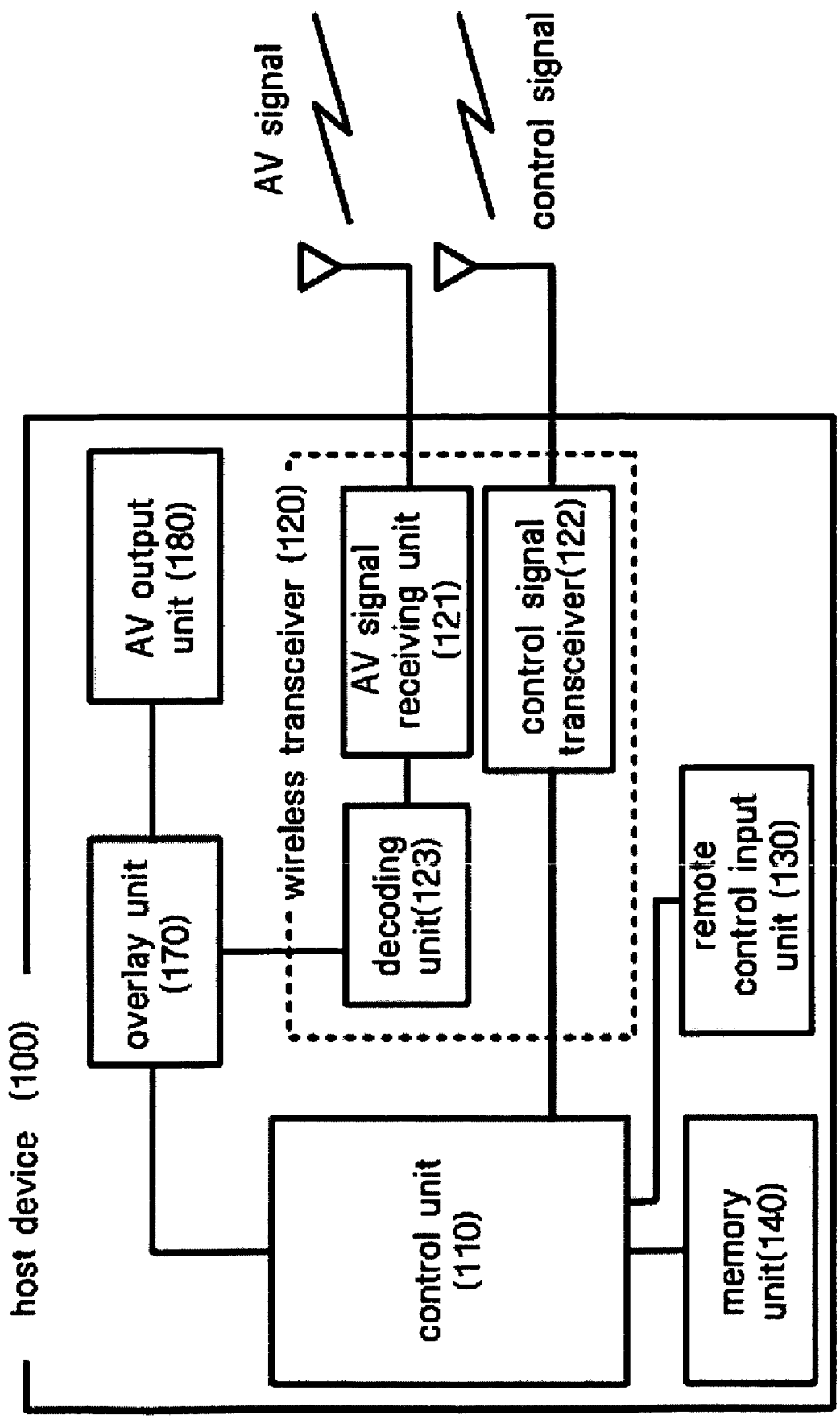
FIG. 5A is a block diagram showing a construction of a host device according to a second embodiment of the present invention.
Figure 5B:
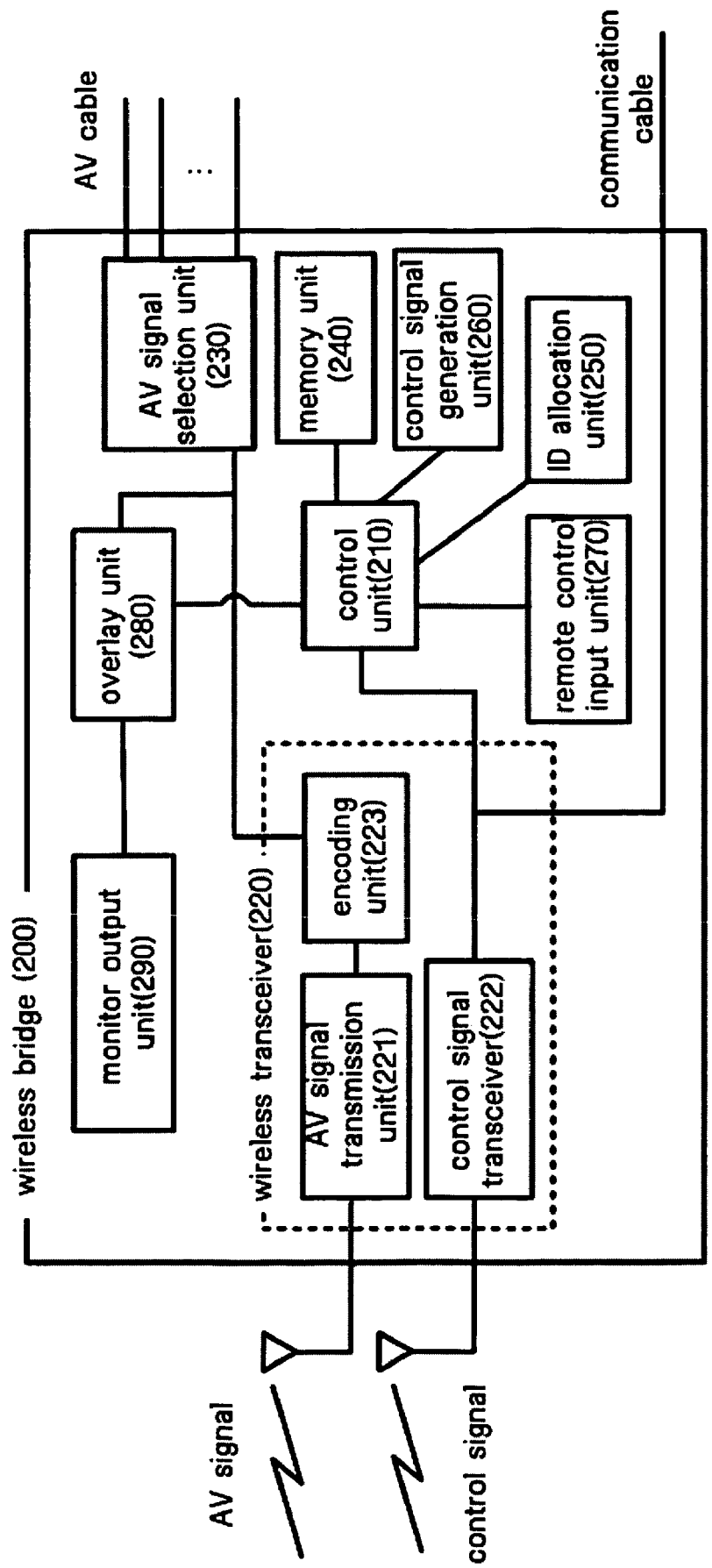
FIG. 5B is a block diagram showing a construction of a wireless bridge according to a second embodiment of the present invention.

FIGS. 5A and 5B are block diagrams showing constructions of the host device 100 and the wireless bridge 200 according to the second embodiment of the present invention. The host device 100 has a construction similar to that of the host device 100 in FIG. 4A, but the host device 100 does not have a function for directly controlling a peripheral device such as a generation of a control signal, an assignment of an ID, etc. Accordingly, the control signal generation unit 160 and the ID allocation unit 150 in FIG. 4A do not exist in the second embodiment. Further, a memory unit 140 does not store device identification IDs or connection state information and stores bitmap information for outputting an OSD to an image. Furthermore, the control signal sent from the control signal transceiver 122 is not a signal for a control command packet capable of controlling a peripheral device, but only a signal for simply re-transmitting a key code of a remote control.

Meanwhile, the wireless bridge 200 may further include a memory unit 240, a control signal generation unit 260, an ID allocation unit 250, a remote control input unit 270, an overlay unit 280 and a monitor output unit 290, in addition to the elements of FIG. 4B.

The memory unit 240 stores device identification IDs allocated to peripheral devices, connection state information representing connection states between the wireless bridge 200 and the peripheral devices and bitmap information for outputting an OSD to an image.

The control signal generation unit 260 generates a control command packet such as a "WhoAreYou" packet for allocating the device identification IDs to the peripheral devices, a packet requesting state information of a device and a packet controlling an ON/OFF state of a device.

The ID allocation unit 250 generates IDs for allocating the device identification IDs to the peripheral devices. For the generation of the IDs, the ID allocation unit 250 must confirm whether the device identification IDs already stored in the memory unit 240 exist or not and prevent IDs to be newly allocated from overlapping with the existing IDs.

The remote control input unit 270 receives a key code value inputted by a user and plays a role of sending a user's command to the wireless bridge 200 together with a control signal for a key code of a remote control transmitted from the host device 100.

The overlay unit 280 overlays the bitmap information for an OSD stored in the memory unit 240 on the image inputted through an AV signal selection unit 230.

The monitor output unit 290 displays the image overlaid by the overlay unit 280 and outputs voice outputted from the decoding unit 223 through a speaker, etc., when outputting voice.

Figure 6B:
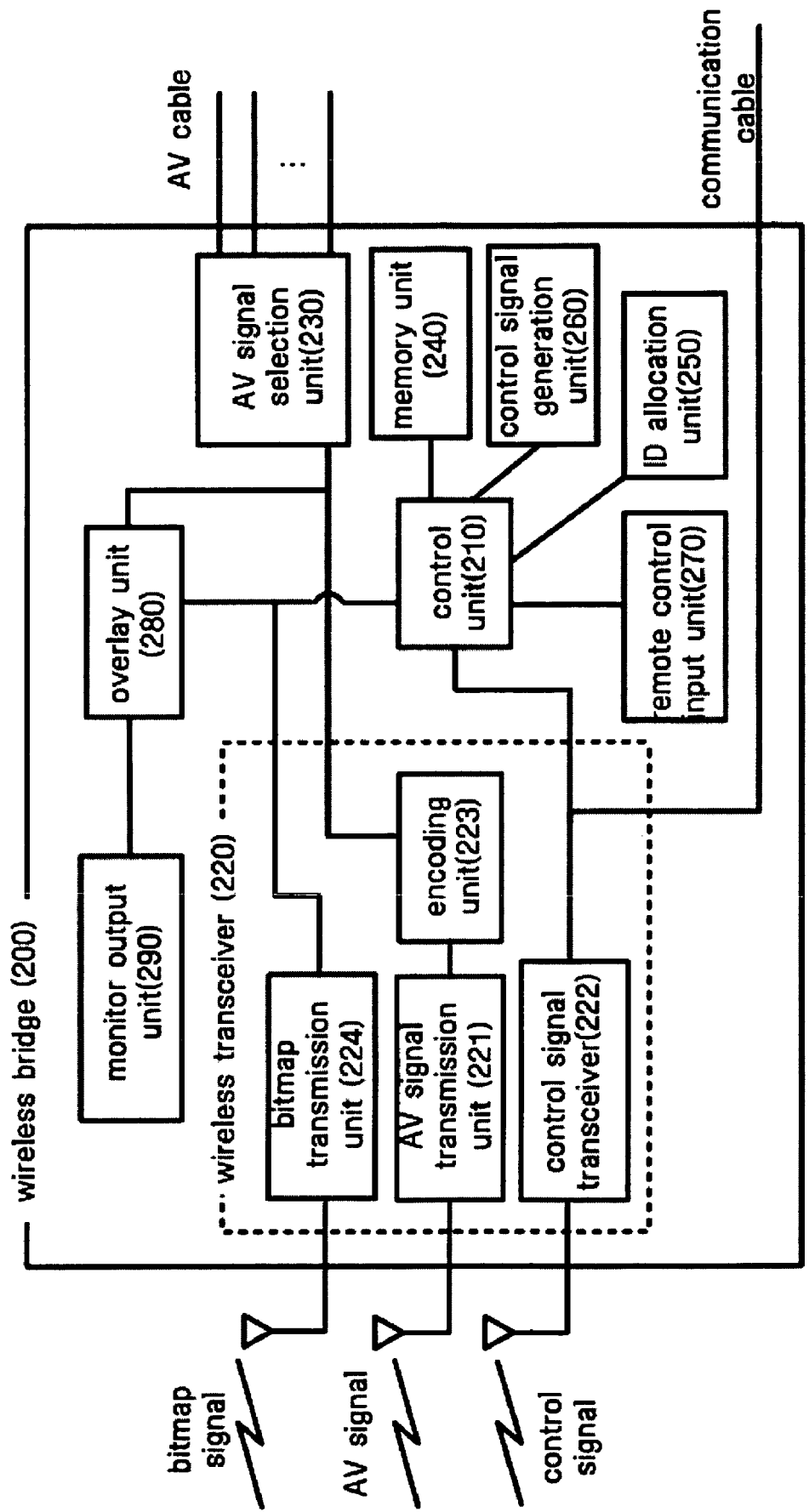
FIG. 6B is a block diagram showing a construction of a wireless bridge according to a third embodiment of the present invention.

FIGS. 6A and 6B are block diagrams showing constructions of the host device 100 and the wireless bridge 200 according to the third embodiment of the present invention. The host device 100 has a construction similar to that of the host device 100 in FIG. 5A. However, when it is compared with the second embodiment, the third embodiment has a difference in that the host device 100 further includes a bitmap reception unit 124 for receiving a bitmap signal for an OSD overlay from the wireless bridge 200 because the host device 100 does not have separate bitmap information for the OSD overlay. Accordingly, the overlay unit 170 generates an image obtained by overlaying a bitmap signal received from the bitmap reception unit 124 on an image decoded by the decoding unit 123 and outputs the generated image to the AV output unit 180. Further, since it is unnecessary for the host device 100 to store bitmap information for an OSD overlay, the memory unit 140 is not entirely necessary.

Meanwhile, the wireless bridge 200 in FIG. 6B has a construction similar to that of the wireless bridge 200 in FIG. 5B. However, when it is compared with the second embodiment, the third embodiment has a difference in that the wireless bridge 200 further includes a bitmap transmission unit 224 for transmitting bitmap information for an OSD overlay generated by the wireless bridge 200 to the host device 100.

Figure 7:
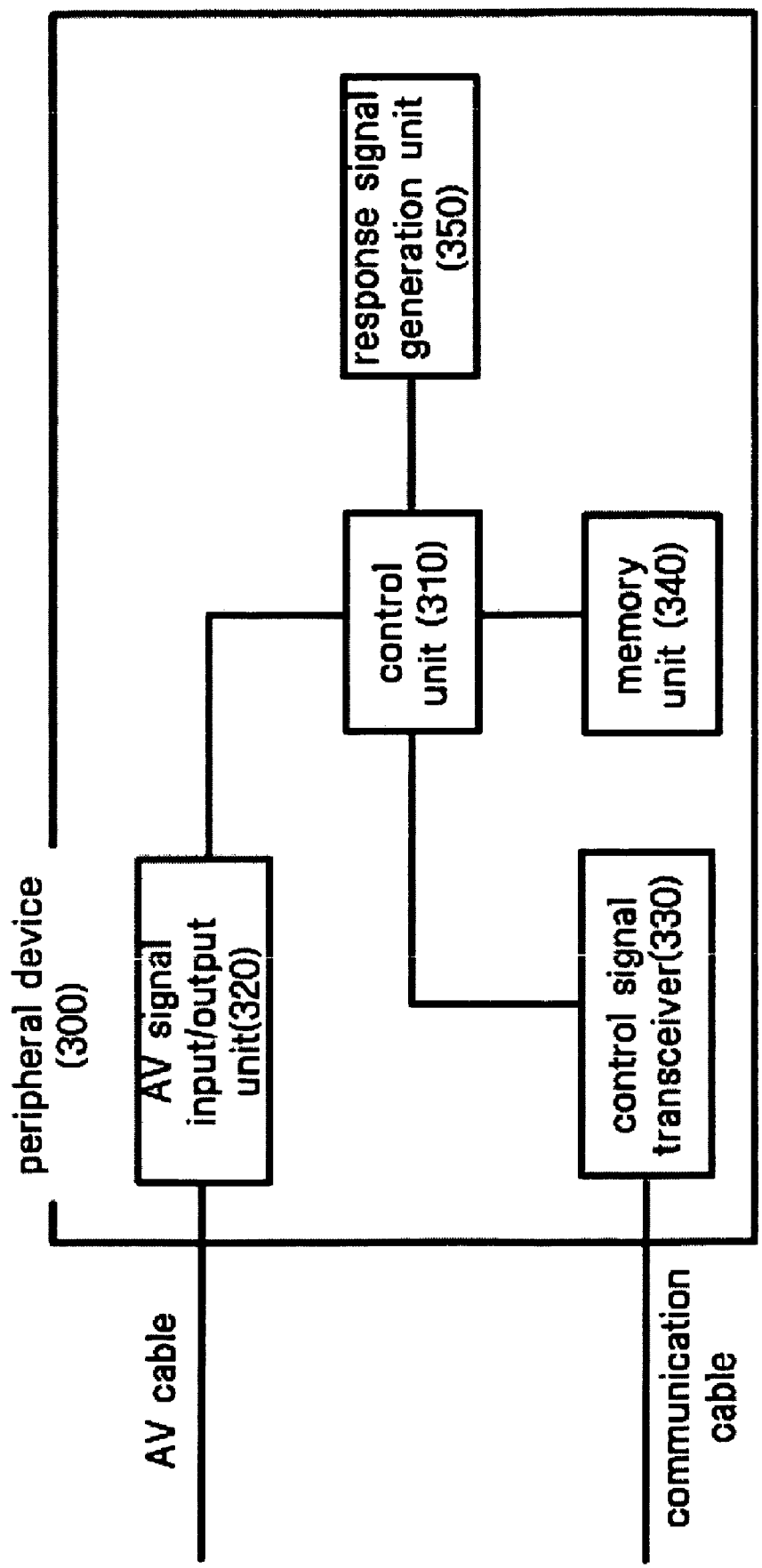
FIG. 7 is a block diagram showing a construction of a peripheral device according to the present invention.

FIG. 7 is a block diagram showing a construction of the peripheral device 300 according to the present invention. The peripheral device 300 according to the present invention may include a control unit 310, an AV signal input/output unit 320, a control signal transceiver 330, a memory unit 340 and a response signal generation unit 350.

The AV signal input/output unit 320 receives an AV signal from the wireless bridge 200 through the AV cable and outputs an AV signal generated by a peripheral device to the wireless bridge 200 through the AV cable.

The control signal transceiver 330 receives a control signal for a packet including various control commands from the wireless bridge 200 through a communication cable, and transmits control signals, which are obtained by converting various response packets for the control commands generated by the response signal generation unit 350 into signals, through the communication cable.

The memory unit 340 stores an inherent device identification ID of a peripheral device allocated from the host device 100 or the wireless bridge 200.

The response signal generation unit 350 generates the response packet for the packet transmitted from the wireless bridge 200.

The control unit 310 plays a role of controlling an operation of each unit and decrypts the packet transmitted from the wireless bridge 200 according to a predetermined protocol.

Figure 8:
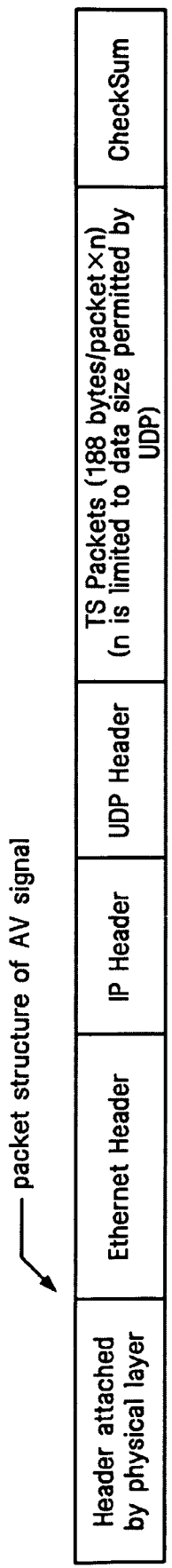
FIG. 8 is a view showing a structure of a packet contained in an AV signal transmitted between a host device and a wireless bridge.

FIG. 8 is a view showing a structure of a packet contained in the AV signal transmitted between the host device 100 and the wireless bridge 200. Basically, the AV signal transmits/ receives a transport packet (TS packet) according to a wireless local area network (hereinafter, referred to as WLAN) standard specification (including the 802.11 family of specifications, such as 802.11a and 802.11b, for example), and has a packet format as shown in FIG. 8. That is, a physical layer header (PHY header) attached to data, which are received from a medium access control (MAC) layer, by a physical layer conforms to the WLAN standard specification. Further, since 1316 bytes are usually sent in a user datagram protocol (UDP) packet, the number of transport packets corresponds to this amount.

Figure 9A:
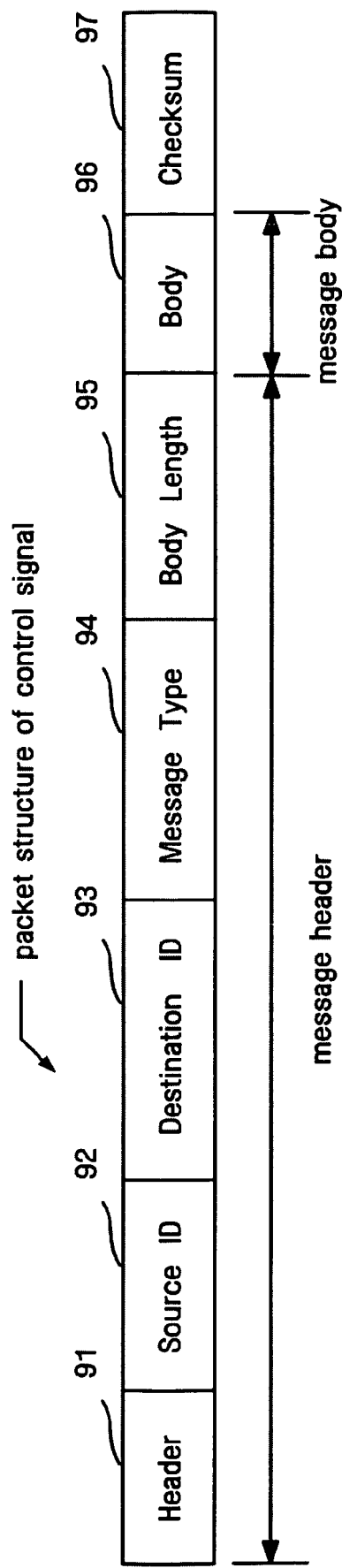
FIGS. 9A to 9D are views showing structures of packets contained in a control signal or a response signal.

FIG. 9A is a view showing a structure of a packet contained in a control signal or a response signal transmitted between the host device 100 and the wireless bridge 200, or the wireless bridge 200 and the peripheral device 300. In the case of the second embodiment and the third embodiment, since the control signal transmitted between the host device 100 and the wireless bridge 200 transmits only the key code of a remote control, the control signal does not have the packet structure as shown in FIG. 9A and simply contains key code information.

Figure 9B:
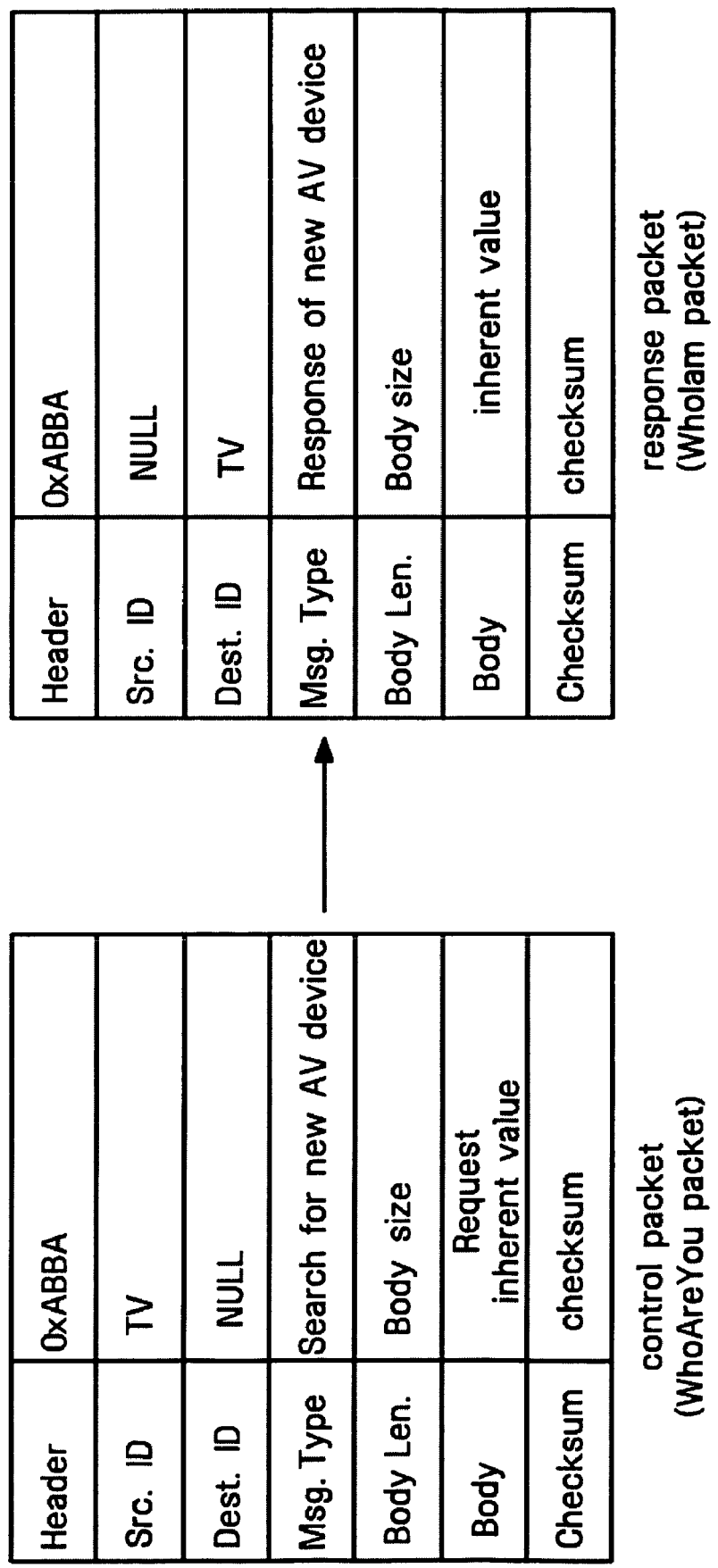

The packet shown in FIG. 9B may include a header field 91 containing identifier information for distinguishing the packet from another kind of packet, a source ID field 92 containing information for identifying a device transmitting the packet, a destination ID field 93 containing information for identifying a device receiving the packet, a message type field 94 representing the kind of the packet, a body length field 95 representing the size of a packet body, the packet body 96 containing data to be actually transceived and a checksum field 97 used in determining whether or not an error exists in a received packet.

Figure 9C:
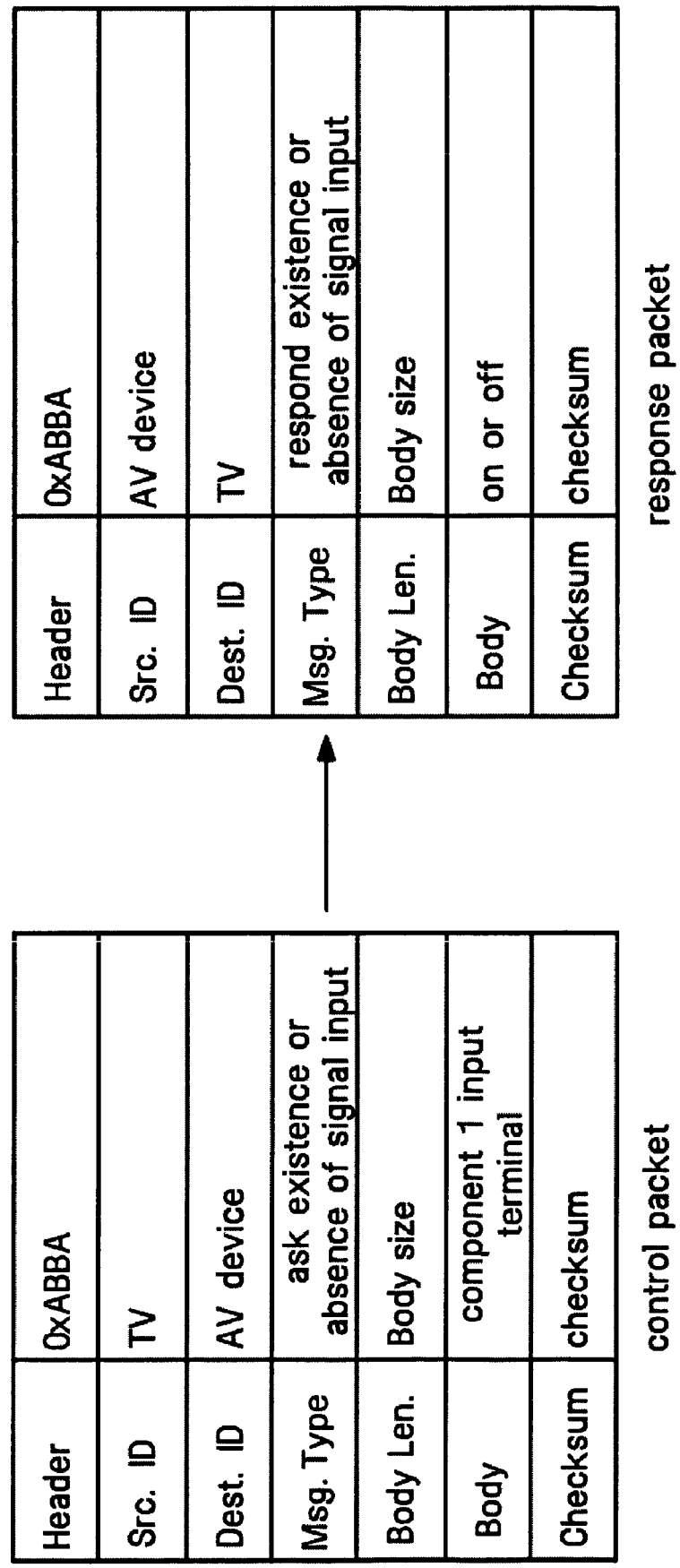
Figure 9D:
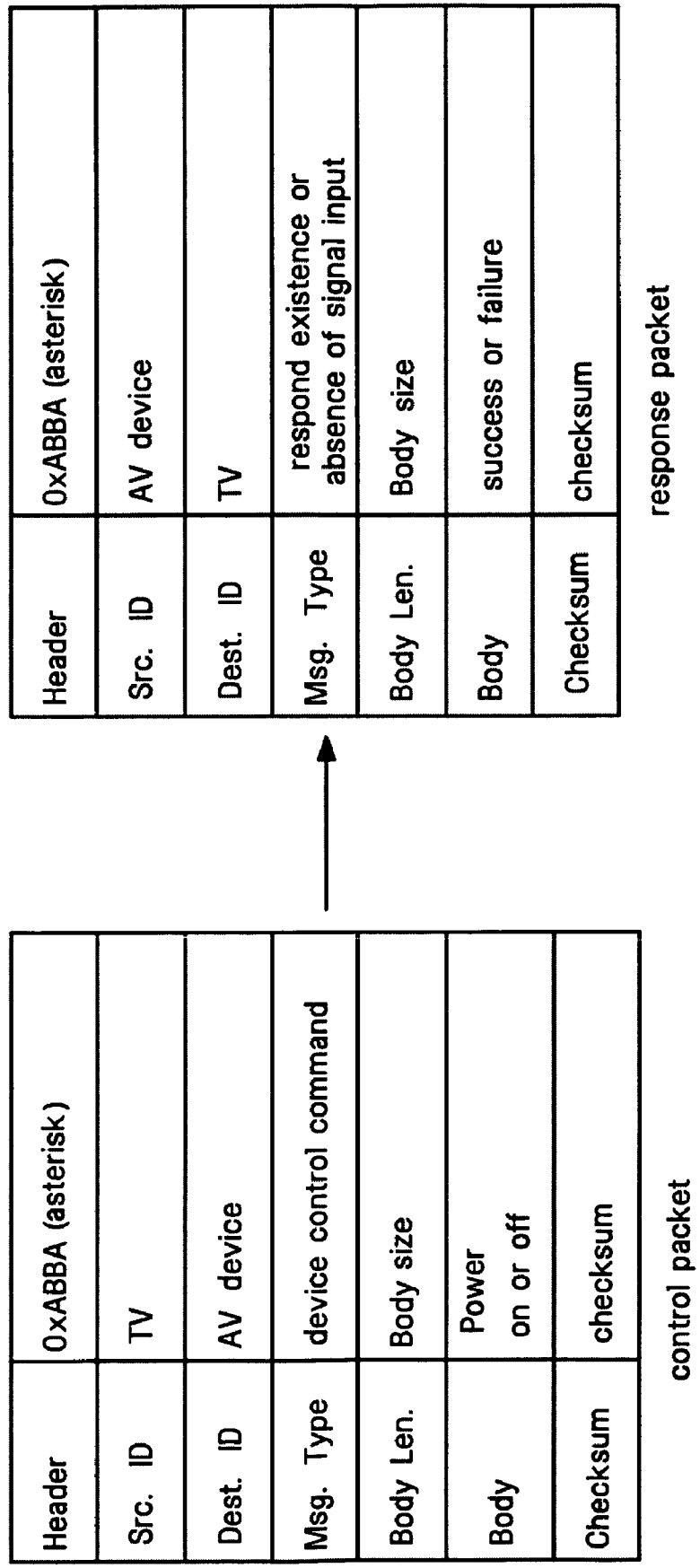

FIGS. 9B to 9D are views illustrating contents recorded in the fields of the packet shown in FIG. 9A. FIG. 9B is a view illustrating structures of a "WhoAreYou" packet for allocating an ID to the peripheral device 300 and a "WhoIAm" packet responding to the "WhoAreYou" packet. First, the contents of the "WhoAreYou" packet will be described. That is, the ID of the video device 400 is recorded in the source ID field 92, and a broadcast ID (e.g., when nothing is written, i.e., a NULL is recorded, it can be called a broadcast) having an undefined reception address is recorded in the destination ID field 93. Further, a search of a new device is recorded in the message type field 94 and 'a request of an inherent ID (i.e. hardware dependent value)' is recorded in the packet body 96.

Next, the contents of the "WhoIAm" packet will be described. A 'NULL' is recorded in the source ID field 92 because an ID has not yet been allocated to the peripheral device 300, and the ID of the video device 400 is recorded in the destination ID field 93. Further, a new device response is recorded in the message type field 94 and the inherent ID of the video device 400 is recorded in the packet body 96.

FIG. 9C is a view illustrating the contents of a packet responding to a request for a check of a connection signal by the video device 400. That is, 'an inquiry into the existence or absence of a signal input' is written in the message type field of a request packet, and 'an input terminal of a component 1' is written in the body field of the request packet. These can be used when confirming the state (i.e., ON or OFF) of the input terminal of the component 1 of a reception side. Accordingly, the peripheral device 300 records the ON state or the OFF state in the body field of a response packet, thereby reporting the state of the input terminal of the component 1 of the reception side.

FIG. 9D is a view illustrating an example of the field name and the contents of a transceived packet used when the video device 400 causes the peripheral device 300 to be powered ON or OFF. That is, 'a device control command' is written in the message type field of a request packet, and 'the ON state or the OFF state of a power source' is written in the body field of the request packet. This packet is a packet transmitted when the video device 400, which is at a transmission side, controls the power of the peripheral device 300. In response to the request, the peripheral device 300 transmits a response packet containing 'success or failure' of the control command recorded in a body field.

As shown in FIG. 10, an operation of the present invention is classified as a device recognition and ID allocation step (S10), a step (S20) of confirming the AV cable connection state of a device, a step (S30) of creating a mapping table, and a device control step (S40) through the retransmission of an integrated remote control signal.

First, the video device 400 detects the peripheral device 300 existing on a network and allocates an ID to the peripheral device 300 (S10). Next, the video device 400 checks the connection state of the peripheral device 300 through the ID allocated to the peripheral device 300 (S20). That is, the video device 400 checks a connection from an output of a device to an input of another device one by one for each device, while considering a plug type. Then, the video device 400 creates the mapping table for determining a device to be controlled by means of a currently checked connection state and state information when one key of the integrated remote control is pressed (S30). Lastly, when a user inputs a key code by using the integrated remote control, the video device 400 performs the device control according to the key code (S40).

Device Recognition and ID Assignment

Figure 11A:
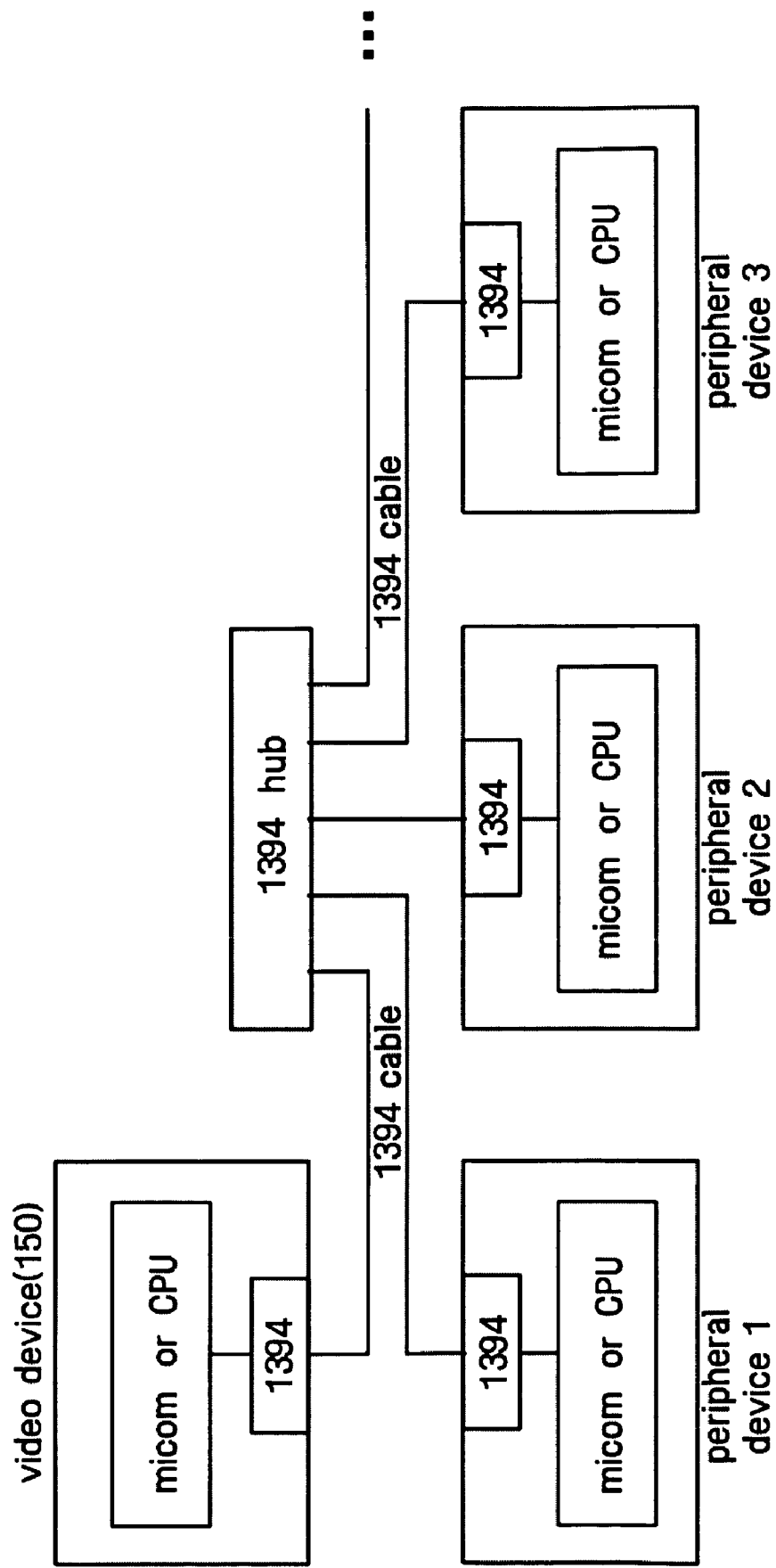
FIG. 11A is a block diagram showing a case in which a video device is connected to peripheral devices through 1394 cables connected to a hub.

FIG. 11A is a block diagram showing a case in which the video device 400 is connected to peripheral devices through 1394 cables connected to a hub. As shown in FIG. 11A, the video device 400 and the peripheral devices are connected to the hub through the 1394 cables. Herein, each device has an inherent ID (i.e., global unique ID) through a mechanism conforming to the IEEE 1394 standard. However, when other peripheral devices are added or deleted, allocated IDs must be reset and new IDs must be allocated. Further, a microcomputer (micom) is a central processing module embedded in a home appliance, etc., and performs the same function as that of a central processing unit (CPU).

Figure 11B:
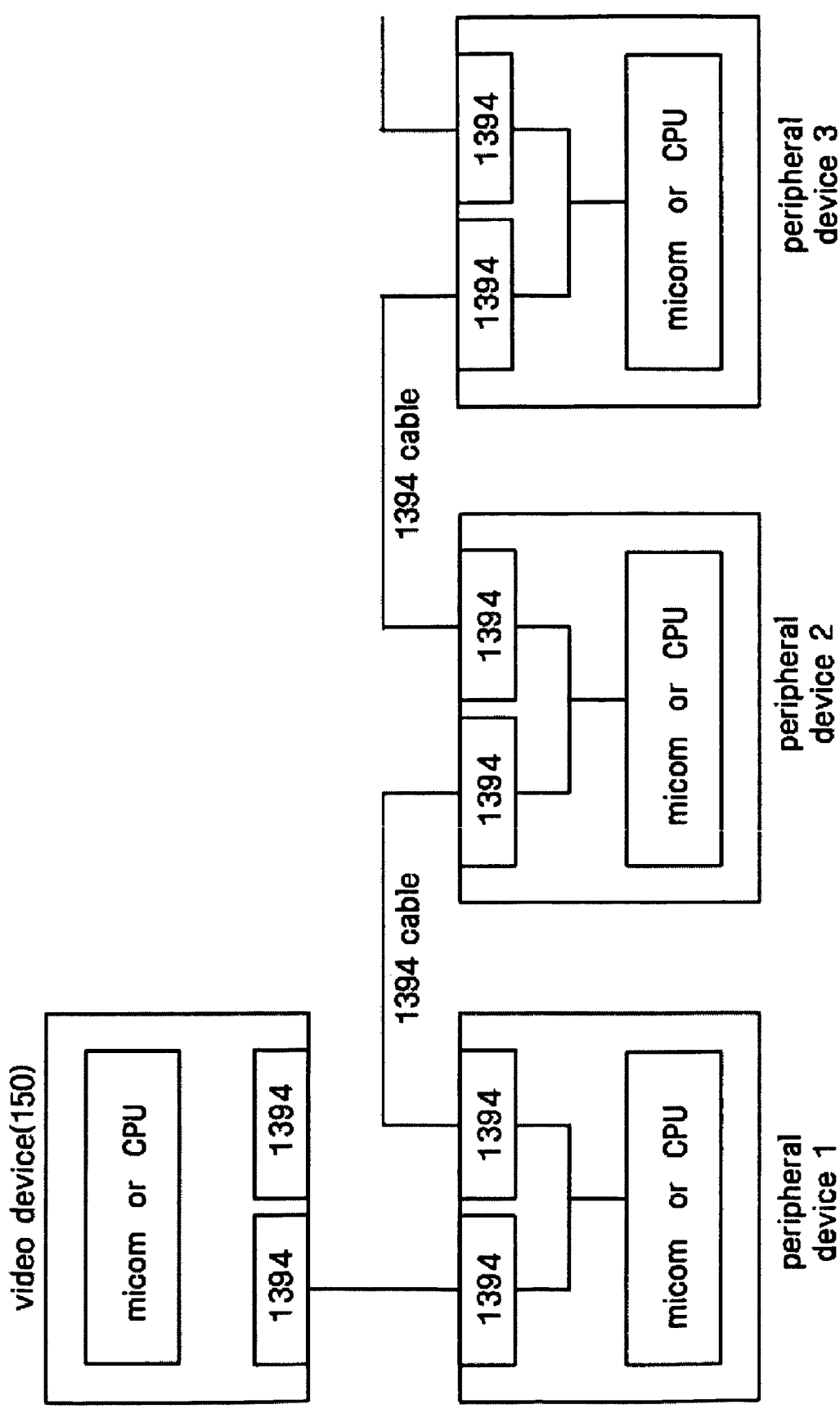
FIG. 11B is a block diagram showing a case in which a video device and peripheral devices are connected by a daisy-chain method rather than using a hub.

FIG. 11B is a block diagram showing a case in which the video device 400 and peripheral devices are connected by a daisy-chain method rather than using a hub. As shown in FIG. 11B, a connection between the video device 400 and one of the peripheral devices, and a connection between the peripheral devices are accomplished by the daisy-chain method using connection lines conforming to the IEEE 1394 standard without using a hub. That is, in the daisy-chain method, the 1394 port of the video device 400 is connected to the first 1394 port of a peripheral device 1 and the second port of the peripheral device 1 is connected to the first 1394 port of a peripheral device 2.

FIG. 11C is a block diagram showing a case in which the video device 400 and peripheral devices are connected through a daisy-chain method by means of a recommended standard 232 revision C (hereinafter, referred to as RS-232C) cable. That is, the universal asynchronous receiver/transmitter (hereinafter, referred to as UART) of the video device 400 is connected to the UART 1 of a peripheral device 1, the UART 1 is connected to the UART 2, and the UART 2 is connected to the UART 1 of a peripheral device 2. In a serial connection method as described above, communication cables using the RS-232C cables connect the video device 400 to the peripheral device 1 through an UART port and connect the peripheral device 1 to the peripheral device 2 through an UART port. Further, a buffer 60 is connected between the UART 2 of the peripheral device 1 and the UART 1 of the peripheral device 2 and the buffer 60 is disabled or enabled according to the control command of the video device 400 which is a master.

When allocating IDs to a plurality of peripheral devices, the video device 400, which is a master, transmits a control command causing the buffer to be disabled to the peripheral devices. Then, the other peripheral devices except for the peripheral device 1 are disabled. Accordingly, the video device 400 (e.g., TV) allocates an ID through communication with the peripheral device 1 and transmits a control command causing a buffer between the peripheral device 1 and the peripheral device 2 to be enabled. When the buffer is enabled according to the control command of the video device 400, the video device 400 allocates an ID through communication with the peripheral device 2. Herein, the video device 400 sends "WhoAreYou" packets (A) to all peripheral devices connected through the communication cables in order to find peripheral devices having no IDs. Then, only the peripheral device 2 having no ID sends a "WhoIAm" packet (B) in response to the "WhoAreYou" packet. Accordingly, the peripheral device 2 receives a new ID from the video device 400.

Figure 12:
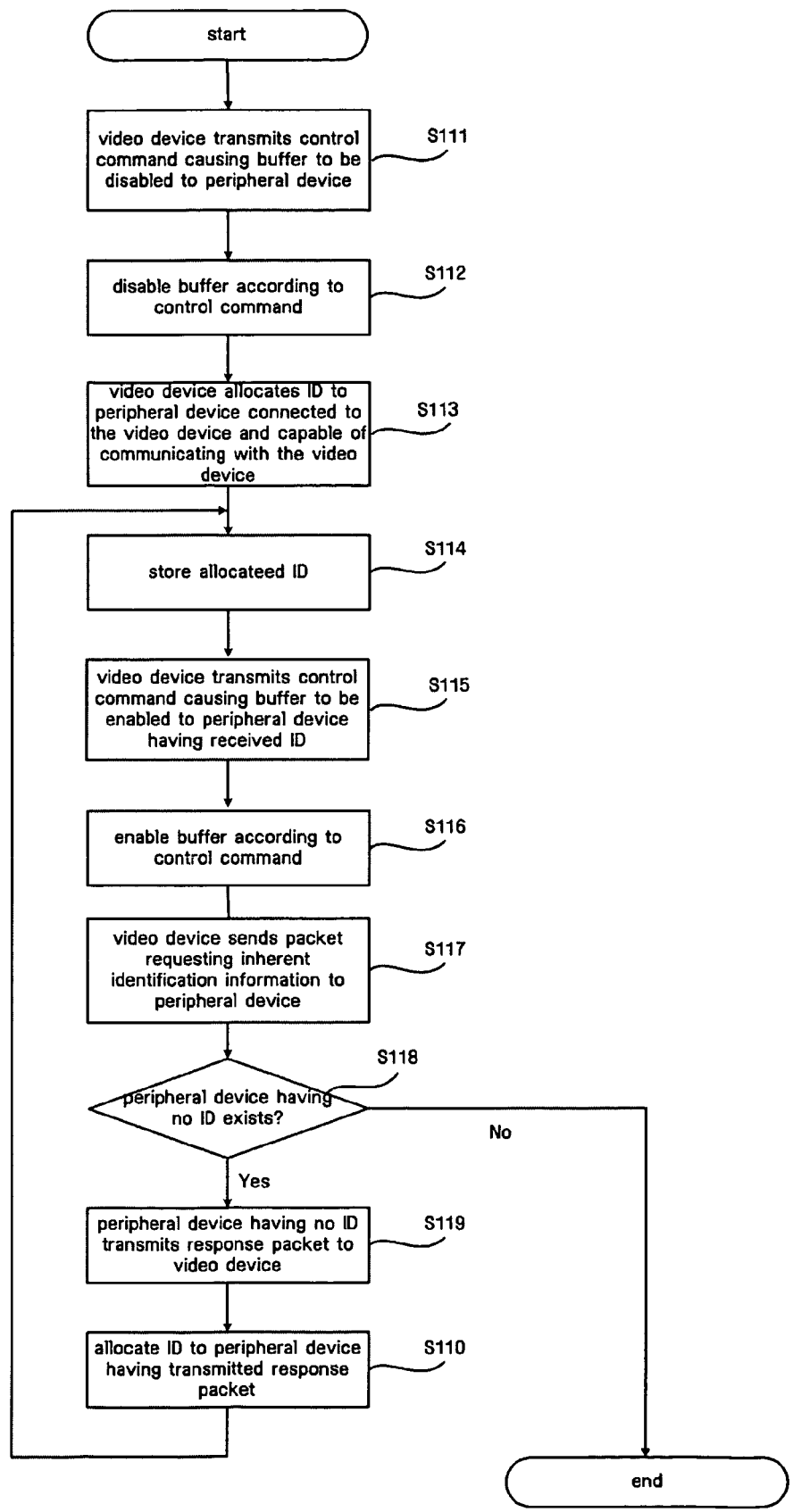
FIG. 12 is a flowchart illustrating a method by which a video device automatically allocates IDs to peripheral devices 300.

FIG. 12 is a flowchart illustrating a method by which the video device 400 automatically allocates IDs to the peripheral devices 300. The method shown in FIG. 12 has been proposed to overcome a problem in that when the peripheral device 300 has a fixed ID and more of the same peripheral devices 300 exist, a processing for discrete ID becomes impossible. For instance, when the peripheral device 300 has a fixed ID and two DVD players exist, a processing for discrete ID becomes impossible. Accordingly, even when a number of the same peripheral devices 300 exist, the video device 400 automatically allocates IDs, thereby enabling the peripheral devices 300 to be distinguished from each other. Therefore, a user can use the peripheral devices 300 differently.

Hereinafter, from among methods for automatically allocating IDs to the peripheral devices 300, a method for allocating the IDs by means of a separate buffer control circuit will be described. Herein, the buffer control circuit is a circuit for interrupting a lower network in order to enable only one peripheral device to communicate with the video device 400 during the course of allocating the IDs to the peripheral devices 300. That is, a peripheral device intended for reception of an ID causes the buffer 60 of the peripheral device to be disabled, thereby disrupting communication with the lower network. Therefore, only the peripheral device can communicate with the video device 400 and receive a unique ID.

Referring to FIG. 12, when the video device 400 intends to assign IDs to a plurality of peripheral devices 300 connected through communication cables, the video device 400 transmits a control command causing the buffers 60 to be disabled to the peripheral devices 300 (S111). Then, the peripheral devices 300 disable the buffers 60 according to the control command of the video device 400 (S112).

In this way, the other peripheral devices 300 except for a peripheral device directly connected to the video device 400 come into a disabled state. Accordingly, only the peripheral device directly connected to the video device 400 communicates with the video device 400 and thus the video device 400 allocates an ID to the peripheral device being in communication (S113). Then, the peripheral device having received the ID from the video device 400 stores the ID in a memory (S114).

Next, the video device 400 transmits a control command causing the buffer 60 to be enabled to the peripheral device having received the ID and the peripheral device having received the ID enables the buffer 60. Therefore, other peripheral devices 300 connected to the peripheral device having received the ID communicate with the video device 400 (S115, S116).

Then, the video device 400 sends a packet (e.g., WhoAreYou packet) for requesting the inherent identification information of a peripheral device in order to find out a peripheral device having no ID. In response to the request of the video device 400, the peripheral device having no ID transmits a response packet (e.g., WhoIAm packet) to the video device 400. Accordingly, the peripheral device having no ID receives a new ID from the video device 400 (S117 to S110).

Next, the peripheral device having received the new ID enables its own buffer 60 for the next the peripheral device. Through such a method, the video device 400, a plurality of peripheral devices having received IDs, and only one peripheral device having no ID are connected to each other.

Then, when the video device 400 allocates an ID to the last peripheral device, there exists no peripheral device having no ID. Accordingly, a procedure by which the video device 400 allocates IDs to all peripheral devices 300 existing in an entire network ends.

Hereinafter, from among methods for automatically allocating IDs to the peripheral devices 300, a method for allocating the IDs in a network including a parallel connection (e.g., connection through 1395 connection lines) will be described.

First, the video device 400 causes a connection with the peripheral devices 300 connected through communication cables to be in the off state, causes a connection with only one peripheral device to be in the on state, and allocates an ID to the peripheral device. Then, the video device 400 causes a connection with the next peripheral device to be in the on state.

Next, the video device 400 sends a packet (e.g., WhoAreYou packet) for requesting the inherent identification information of a peripheral device in order to find a peripheral device having no ID. In response to the request of the video device 400, the peripheral device having no ID transmits a response packet (e.g., WhoIAm packet) to the video device 400. Accordingly, the peripheral device having no ID receives a new ID from the video device 400.

Then, the video device 400 causes a connection with the next peripheral device to be in the on state. Through such a method, the video device 400 can assign IDs to all peripheral devices 300 existing in the network.

FIG. 13 is a view showing an algorithm for checking whether or not a peripheral device on a network is deleted in a method of automatically allocating an ID to the peripheral device. The video device 400 must frequently check whether or not the peripheral device 300 connected through a communication cable is added or the peripheral device 300 is deleted.

First, a method for determining whether or not the peripheral device 300 connected through the communication cable is deleted will be described. As shown in FIG. 11C, the network connected through the RS-232C cable updates the state of the network at a time point at which the network is used by a user's request or the necessity of the video device 400. In updating the state of the network, the network reflects state information of already registered peripheral devices 300. Herein, when there is no response of the peripheral device 300, it is determined that the peripheral device 300 having not sent a response has been deleted from the network, and the corresponding peripheral device 300 is deleted from a list.

Next, a method for determining whether or not a new peripheral device has been added to the network will be described. In the network connected through the RS-232C cable, the video device 400 cannot automatically understand whether or not the new peripheral device 300 has been added to the network. Accordingly, in order to understand whether or not the new peripheral device 300 has been added to the network, the video device 400 must confirm whether or not the peripheral device 300 having no ID exists on the network. Herein, since multiple peripheral devices 300 cannot be registered at the same time, the video device 400 causes the peripheral device 300 having no ID to disable a buffer, and a peripheral device having an ID to enable a buffer. Accordingly, peripheral devices 300 having not been registered can be registered one by one.

Confirmation of the AV Cable Connectivity to a Device

Figure 14A:
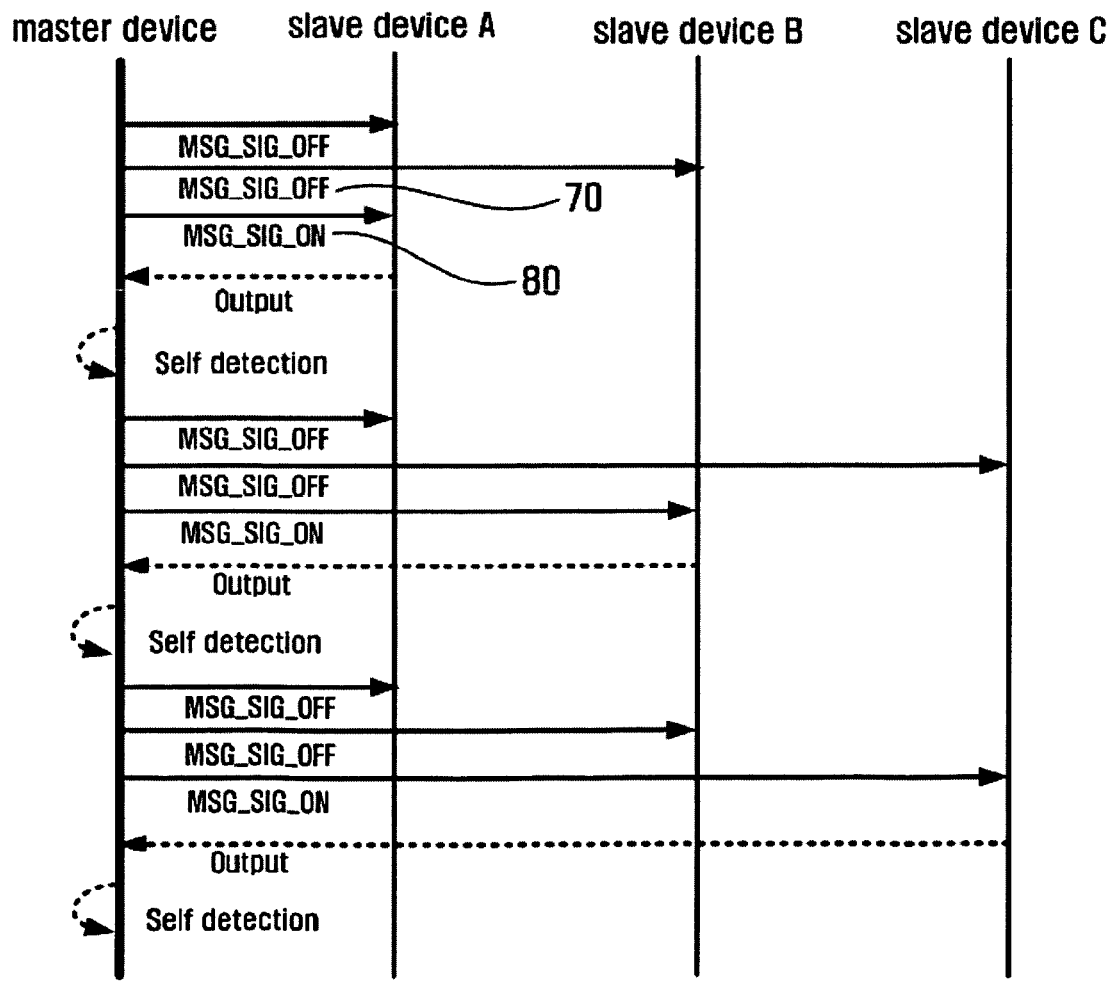
FIG. 14A is a view illustrating a method of investigating only an external input of a TV.
Figure 14B:
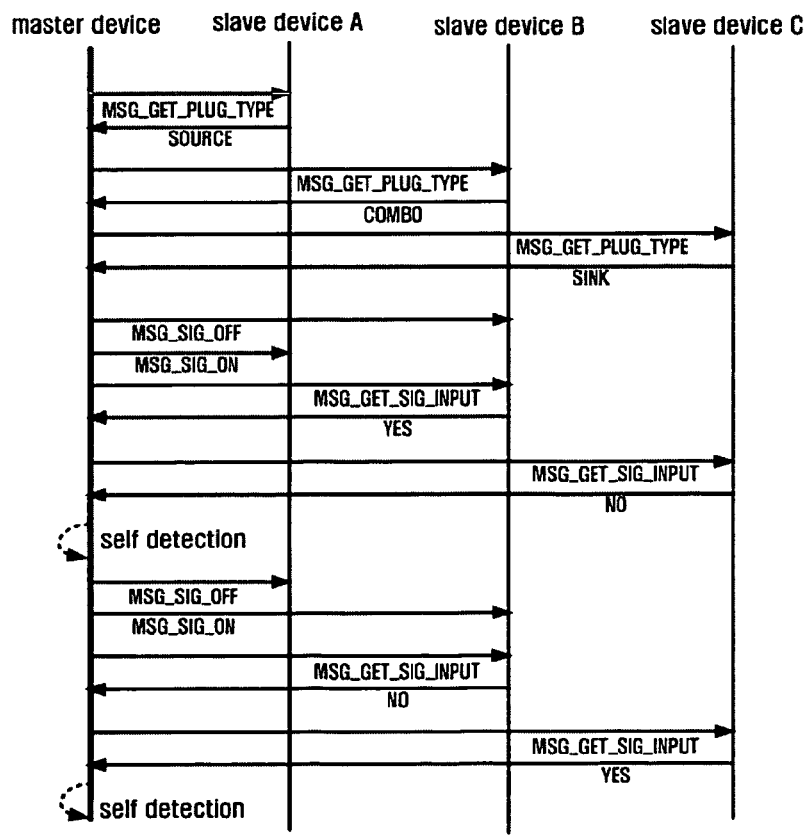
FIG. 14B is a view illustrating a method of investigating a relationship of external inputs/outputs of various devices besides a TV.

FIGS. 14A and 14B are views illustrating methods by which the video device 400 obtains connection information for a peripheral device. FIG. 14A is a view illustrating a method of investigating only an external input of a TV and FIG. 14B is a view illustrating a method of investigating a relation of external inputs/outputs of various devices besides a TV. Herein, a recognition unit 600 investigates the connection information, thereby enabling the video device 400 to understand connection information regarding connectivity between the peripheral device 300 and other peripheral devices 300 in addition to the video device 400. Therefore, the video device 400 can control a corresponding peripheral device 300

First, the method of investigating only the external input of the TV will be described. Herein, when it is assumed that all peripheral devices 300 in a network are source devices having only output plugs, the output plugs of the peripheral devices 300 are connected to the video device 400. The video device 400 inspects connection configurations of the peripheral devices 300 one by one and can understand the connection configurations.

Referring to the program 4 and the flowchart shown in FIG. 14A, the video device 400 causes signals of a peripheral device A, a peripheral device B and a peripheral device C to be in the on state successively. The video device 400 inspects external inputs to which each peripheral device has been connected. That is, the video device 400 transmits a MSG_SIG_ON signal 80 and a MSG_SIG_OFF signal 70 to each peripheral device and each peripheral device causes its own output signal to be in the on or the off state according to the transmitted signals. The MSG_SIG_ON signal 80 and the MSG_SIG_OFF signal 70 are commands enabling each peripheral device to the output signal capable of being outputted from each peripheral device to be in the on or the off state. When the peripheral device does not support the commands, the commands can be simply achieved through a power on/off function. That is, when the peripheral device is powered off, the peripheral device does not output a signal. In contrast, when the peripheral device is powered on, the peripheral device outputs a signal. Accordingly, the video device 400 can obtain the connection information for each peripheral device.

The method shown in FIG. 14B of investigating a relationship of external inputs/outputs of various devices other than a video device will be described. Herein, various peripheral devices as well as source devices may exist in a network. That is, when constructing a network including a combo device having both an input plug and an output plug, a sink device having only an input plug, and an isolated device having neither an input plug nor an output plug, it is necessary to consider the relationship of external inputs/outputs. Further, since the isolated device is a device supporting only a control in the network and does not have the input plug and the output plug, it is unnecessary to inspect a connection state of a signal cable between the isolated device and another device. Accordingly, the isolated device is not taken into account here.

Referring to the program 5 and the flowchart shown in FIG. 14B, the video device 400 inspects plug types of all peripheral devices 300 existing in the network and selects only a source device and a combo device which are objects of consideration. Next, the video device 400 causes an output of only one of the peripheral devices having output plugs to be in the on state. Further, in order to find out an input terminal to which the output of the peripheral device is inputted, the video device 400 inspects a sink device and a combo device having an input plug to understand the connectivity of plugs.

For instance, when one source device, one sink device and one combo device are connected to each other, the video device 400 finds out input/output types of the peripheral devices 300 in an entire network, causes only one of peripheral devices having output plugs to perform an output and causes the other peripheral devices having output plugs not to perform an output.

Next, the video device 400 asks a peripheral device having an input plug whether or not an input is currently coming and understands a current connection state. That is, when it is assumed that a peripheral device A is the source device, a peripheral device B is the combo device and a peripheral device C is the sink device, the video device 400 causes only the peripheral device A to perform an output and causes the peripheral device B not to perform an output. Then, the video device 400 asks the peripheral device B and the peripheral device C having input plugs whether or not inputs are currently coming and understands a current connection state. Accordingly, the video device 400 can find out that the output of the peripheral device A is connected to the input of the peripheral device B, and the output of the peripheral device B is connected to the input of the peripheral device C.

Figure 15:
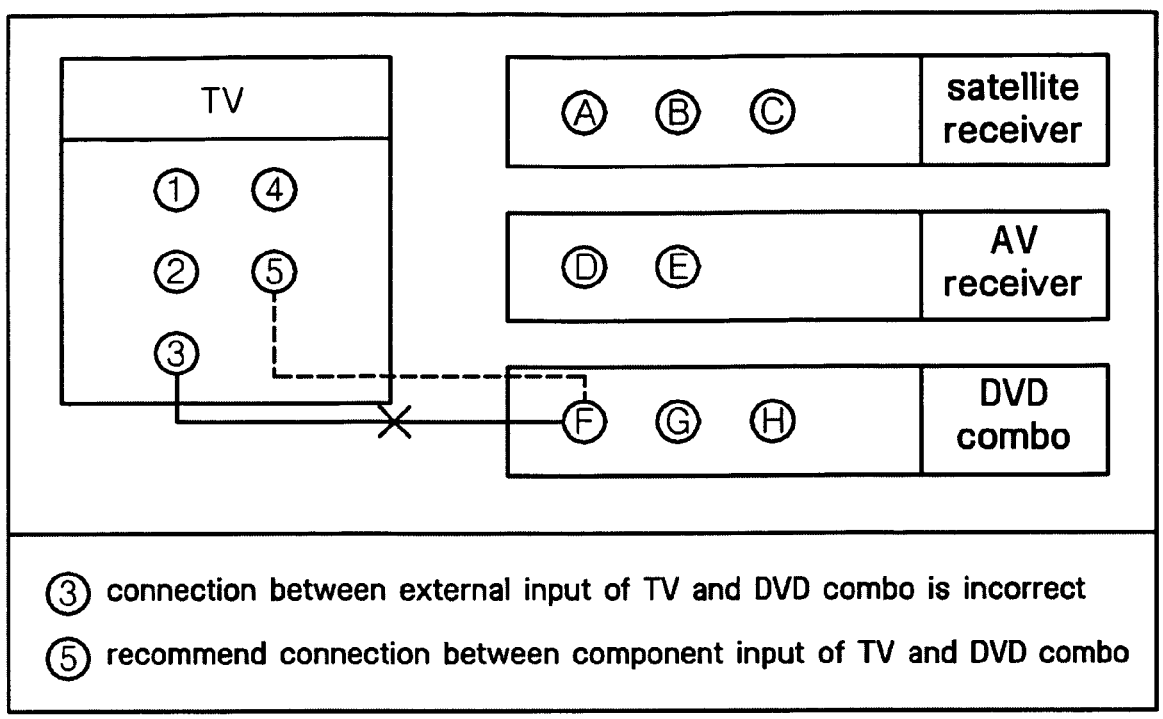
FIG. 15 is a view showing a current connection state to a user.

As a result of understanding of the connection between the devices through the methods shown in FIGS. 14A and 14B, when the connection has not been normally accomplished, the video device 400 shows not only the current connection state to a user but also an optimum connection state as shown in FIG. 15. Therefore, the user can check and change a connection setting state. In contrast, when the connection has been normally accomplished, the video device 400 informs the user of a normal connection through a screen and sound.

In addition, lines connecting the video device 400 to a DVD player move or flicker, thereby producing an animation effect. Furthermore, when a color expression is necessary, lines or plugs attached to the end of the lines have different colors, thereby increasing the visual effect.

Creation of a Mapping Table

FIGS. 16A and 16B are views showing mapping tables according to the present invention. FIG. 16A is a view showing a mapping table when an external input device is a DVD combo and FIG. 16B is a view showing a mapping table when an external input device is a set-top box (hereinafter, referred to as STB). Since the mapping tables include control operations according to state information of peripheral devices 300, when a key code value is inputted by a user, the peripheral devices 300 are controlled by the control operations.

Hereinafter, a method of creating the mapping tables will be described. First, in order to detect the peripheral devices 300 connected to the video device 400 through communication cables, the video device 400 obtains connection information of the peripheral devices 300 through device identification IDs allocated to the peripheral devices 300. That is, the video device 400 understands the connectivity between the peripheral device 300 and other peripheral devices 300 in addition to the video device 400.

Accordingly, the mapping tables contain control commands according to each peripheral device generated on the basis of device information or connection information of the peripheral devices 300. Further, the control command stored in the mapping table may be expressed by one operation item and a user may select a desired operation item.

Figure 17:
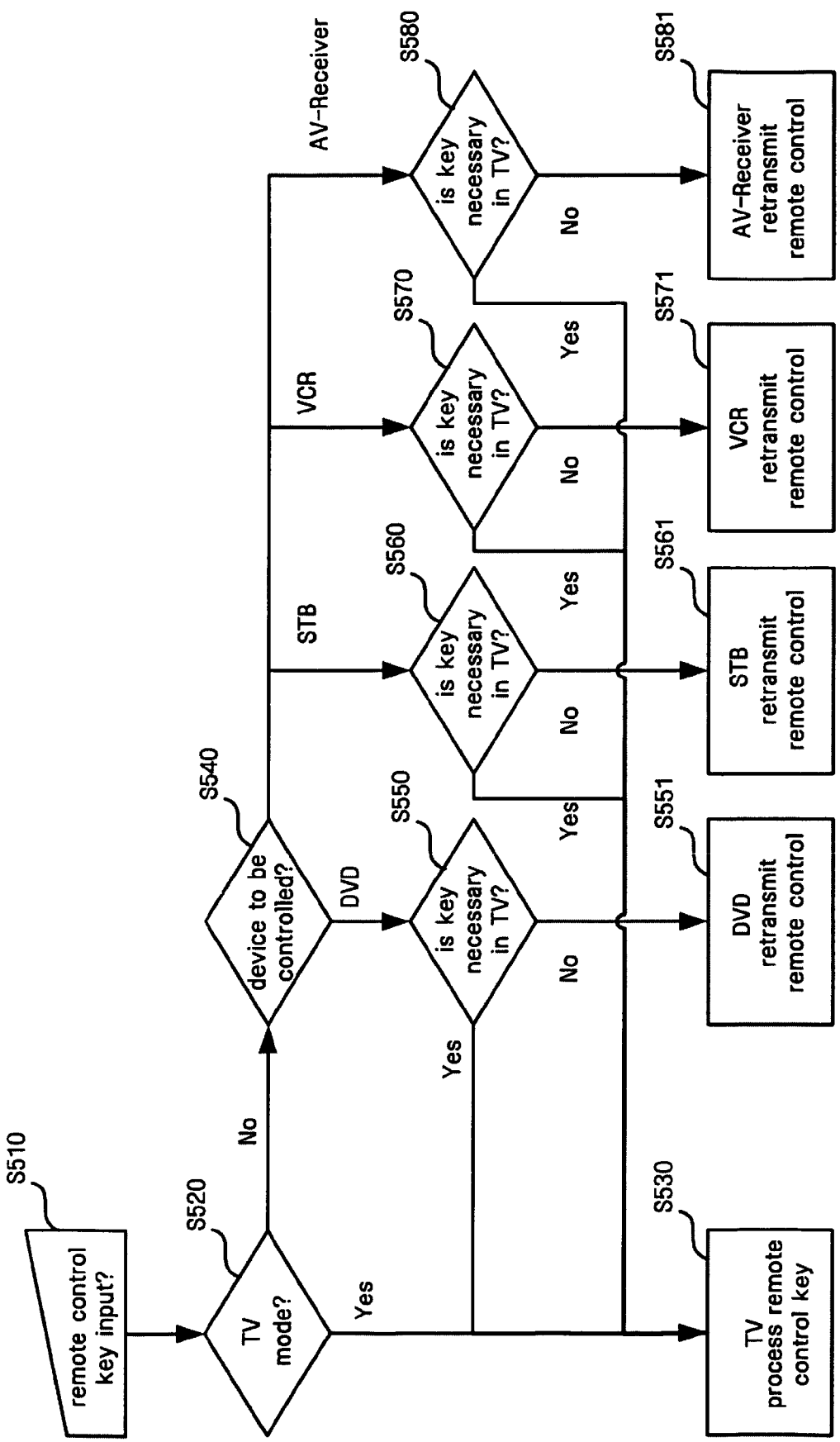
FIG. 17 is a flowchart illustrating a method for controlling an entire device by means of one remote control according to a mapping table.

FIG. 17 is a flowchart illustrating a method for controlling an entire device by means of one remote control according to a mapping table. First, after having detected peripheral devices connected through communication cables and having allocated device identification IDs to the detected peripheral devices through a process identical to the aforementioned device recognition and ID assignment, the video device 400 receives a predetermined key code from a remote control through the remote control input unit 130 of the video device 400 (S510). Next, the video device 400 determines by considering the mapping table whether the current remote control input is a mode for remote control retransmission to other peripheral devices or a mode for controlling the video device 400. As a result of the determination, when the current remote control input is the mode for controlling the video device 400 (Y of S520), the video device 400 processes the key code of the remote control and controls its own operation corresponding to the key code (S530). In contrast, when the current remote control input is the mode for the remote control retransmission to other peripheral devices (N of S520), the video device 400 finds out a peripheral device transmitting a signal to the video device 400 and being an object of a control (S540), and controls an operation of the video device 400 or the peripheral device according to the mapping table. In the present embodiment, in the case in which the peripheral device is a DVD player, a VCR, a STB, or an AV-receiver, when the peripheral device is the DVD player and the operation corresponding to the key code is performed in the video device 400 in the mapping table as shown in FIG. 16, a user interface of the video device 400 is displayed and an input of a user is received (S550). In contrast, when the operation is performed in the DVD player, the remote control input is retransmitted to a DVD player remote control and the operation of the DVD player corresponding to the key code is controlled (S551). The control of the DVD player operation is performed through the request packet as shown in FIG. 9D, which contains a control command and is transmitted from the video device 400 to the DVD player. In response to the control command, the DVD player transmits a response for the command to the video device 400 through the response packet as shown in FIG. 9D.

Meanwhile, when the peripheral device is the STB and the operation corresponding to the key code is performed in the video device 400 in the mapping table as shown in FIG. 16, a user interface of the video device 400 is displayed and an input of a user is received (S560). In contrast, when the operation is performed in the DVD player, the remote control input is retransmitted to a DVD player remote control and the operation of the DVD player corresponding to the key code is controlled (S561). The control of the DVD player operation is performed through the request packet as shown in FIG. 9D, which contains a control command and is transmitted from the video device 400 to the DVD player. In response to the control command, the DVD player transmits a response for the command to the video device 400 through the response packet as shown in FIG. 9D. Further, when the peripheral device is the VCR or the AV-receiver, a process identical to the aforementioned process is performed.

Device Control Through the Retransmission of an Integrated Remote Control Signal Operations according to the three embodiments relating to methods by which the host device 100 automatically controls a series of operations of AV devices by means of one integrated remote control are as follows. Basically, the host device 100 receives an MPEG AV signal wirelessly transmitted from the wireless bridge 200 through the wireless transceiver 120 and decodes the received MPEG AV signal. Then, the host device 100 receives and displays the decoded MPEG AV signal through one fixed input (e.g., DVI input) port.

Figure 19:
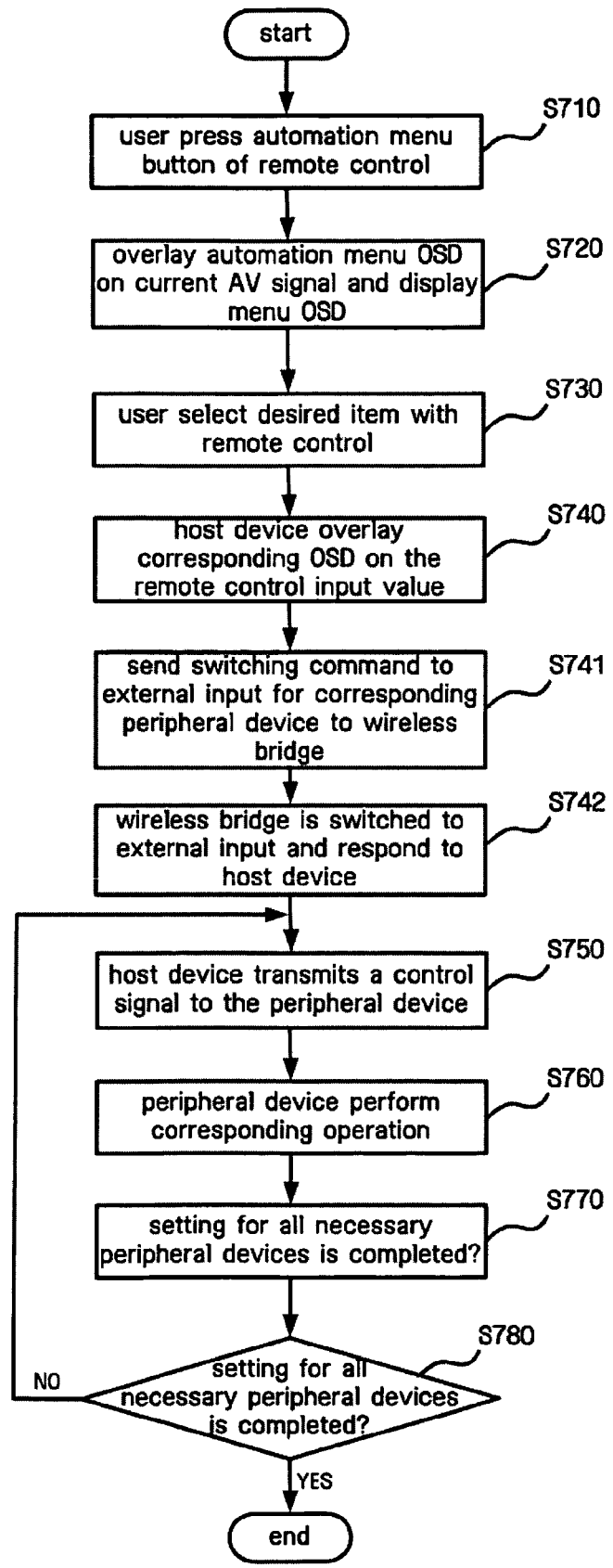
FIG. 19 is a flowchart illustrating an operation of the first embodiment in S40 of FIG. 10.

First, an operation according to the first embodiment will be described with reference to FIG. 19. The host device 100 performs a remote control input, a command processing and a corresponding automation process, generates control signals to be transmitted to the peripheral devices 300 and transmits the generated control signals to the wireless bridge 200 wirelessly. The wireless bridge 200 transmits the control signals received from the host device 100 to the peripheral devices 300 through communication cables and transmits a command reception confirmation and a control state of an AV device to the host device 100. That is, the host device 100 plays a role of performing a command processing according to a remote control input, a control automation process, a state management for AV devices, etc. The wireless bridge 200 plays a role of simply transmitting a control signal or a state signal between the host device 100 and the AV devices.

Figure 18:
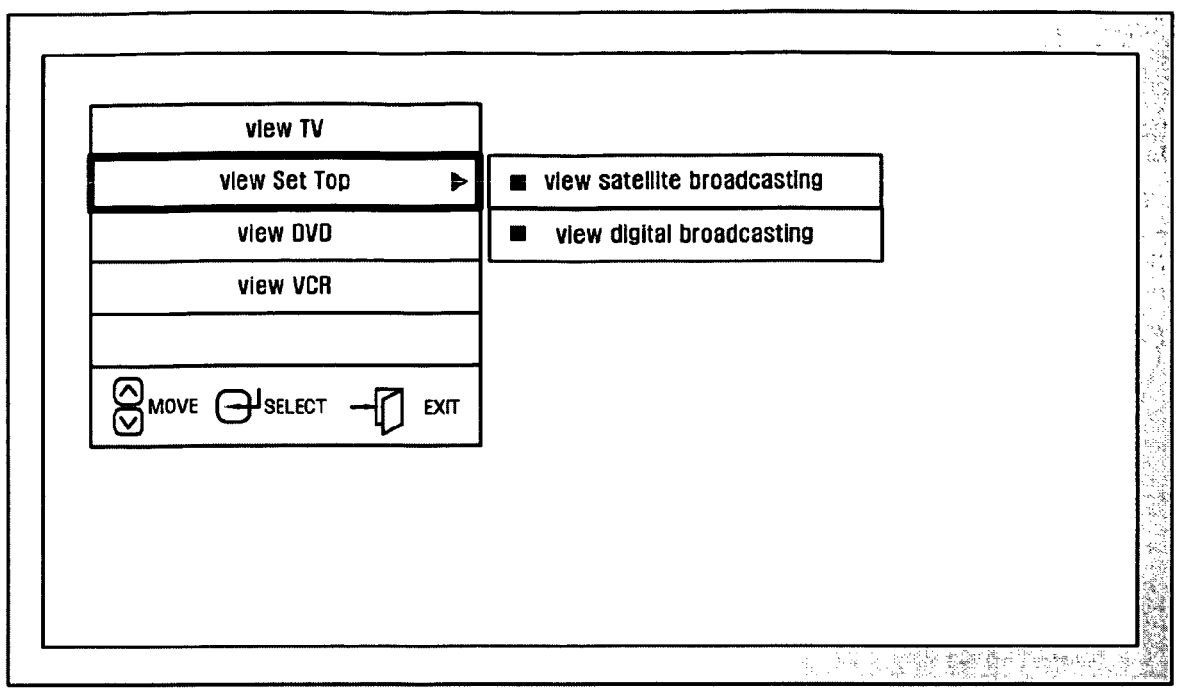
FIG. 18 is a screen showing an automated OSD menu.

Detailed operation will be described with reference to FIG. 19. When a user presses the automation menu button of the remote control (S710), the host device 100 receives a remote control input value corresponding to the automation menu button, overlays an automation OSD menu stored in the memory unit 140 on a current AV signal through the overlay unit 170, and displays the screen as shown in FIG. 18 (S720).

When the user presses the direction key button of the remote control, the host device 100 overlays the OSD menu having a changed focus on the current AV signal according to a remote control input value corresponding to the direction key button, and displays the overlaid OSD through the screen. Then, when the user selects a desired item (e.g., DVD view) from the OSD menu (S730), the host device 100 analyzes a remote control input value, recognizes that the DVD view has been pressed by the user and outputs a proper OSD on the screen (S740).

Then, the following automation process starts. In the automation process, when the host device 100 transmits an operation command to the peripheral device 300 through a control signal (S750), the peripheral device 300 performs a corresponding operation according to the control signal (S760) and transmits a result of the operation performance to the host device 100 through a response signal, and the two steps are repeated until a setting is completed for all necessary devices (S770).

The automation process will be described according to each peripheral device 300. First, when the host device 100 sends a switching command to an external input to which an AV signal line of a DVD player is connected to the wireless bridge 200 through the control signal (S741), the wireless bridge 200 is switched to the external input and responds to the host device 100 by transmitting a control signal corresponding to the switched state (S742).

When a predetermined peripheral device (e.g., AV receiver) exists, the host device 100 sends a power-on control signal of the peripheral device to the wireless bridge 200 and the wireless bridge 200 sends the control signal to the corresponding peripheral device through the communication cable (S750). Then, the peripheral device is powered on by the control signal (S760) and sends a response signal to the host device 100 via the wireless bridge 200 (S770).

Further, the host device 100 sequentially sends an external input switching command and a field effect command of the peripheral device and a control signal of checking the state of the peripheral device to corresponding peripheral device through the wireless bridge 200 (S750) and the peripheral device sends a response signal containing a switching result and a field effect state to the host device 100 through the wireless bridge 200 (S770).

Next, the host device 100 sends a power-on control signal of the DVD player to the wireless bridge 200 (S750), the wireless bridge 200 sends the control signal to the DVD player and the DVD player is then powered on (S760). Further, the wireless bridge 200 sends a response signal containing the state of the DVD player to the host device 100 (S770).

Last, the host device 100 sends a control signal containing a DVD play command to the DVD player through the wireless bridge 200 (S750), and the DVD player executes a playback (S760) and sends a response signal containing the execution state to the host device 100 via the wireless bridge 200 (S770).

Consequently, a user selects only a menu item, AV devices are automatically set and the user can simply obtain a desired operation result. In addition, when a response of a certain device is normally performed during the automation process, the host device 100 displays the screen as shown in FIG. 15 to the user, thereby enabling the user to perform a correct connection setting.

Hereinafter, operations according to the second and the third embodiments will be described.

When the host device 100 transmits a remote control input value to the wireless bridge 200 through the control signal transceiver 122, the wireless bridge 200 analyzes the inputted remote control input value, performs a command processing and a corresponding automation process, generates control signals to be transmitted to the peripheral devices 300 and transmits the generated control signals to the peripheral devices 300 through communication cables while confirming control states of the peripheral devices 300. Then, the peripheral devices 300 send a response signal containing a command performance result to the host device 100.

That is, the host device 100 plays a role of simply retransmitting the remote control input value to the wireless bridge 200 and the wireless bridge 200 plays a role of performing a command processing, a control automation process, a state management for the peripheral devices, etc. Such a method may be classified as a first method (second embodiment) by which the host device 100 and the wireless bridge 200 manage OSDs respectively according to the management subject of the OSD, and a second method (third embodiment) by which the wireless bridge 200 manages an OSD and transmits only an OSD bitmap image to the host device 100.

First, a detailed operation according to the second embodiment will be described with reference to FIG. 20. This case is a case in which both the host device 100 and the wireless bridge 200 have OSD bitmaps stored in the memory units 140 and 240 and have an ability of independently displaying OSDs. When a user presses the automation menu button of the remote control, the host device 100 transmits a remote control key code corresponding to the automation menu button to the wireless bridge 200 through the control signal transceiver 122.

The wireless bridge 200 overlays a OSD menu bitmap stored in the memory unit 240 therein on an AV signal through the overlay unit 280, sends the overlaid OSD menu bitmap to a monitor output and simultaneously sends an ACK signal to the host device 100 through the control signal transceiver 122. The host device 100 having received the ACK signal also overlays a OSD menu on the AV signal and displays the OSD menu on a screen.

When the user presses the direction key button of the remote control, the host device 100 sends a remote control value corresponding to the direction key button to the wireless bridge 200. The wireless bridge 200 overlays the OSD menu having a changed focus on the AV signal, sends the overlaid OSD menu to a monitor output and simultaneously sends an ACK signal to the host device 100. Then, the host device 100 also overlays the OSD menu having a changed focus on the AV signal and displays the overlaid OSD through the screen. Accordingly, the host device 100 and the wireless bridge 200 can be synchronized with the focus state of the OSD.

In such a case, in addition to a method by which the host device 100 directly sends the remote control value to the wireless bridge 200 and displays an OSD window after the wireless bridge 200 sends the ACK signal, there may exist a method by which the host device 100 outputs an OSD on a screen and simultaneously sends the remote control value to the wireless bridge 200, thereby accomplishing synchronization.

When the user selects a desired item (e.g., DVD view) on a menu (S800), the host device 100 transmits a control signal according to a remote control key code to the wireless bridge 200 (S810). The wireless bridge 200 recognizes that the DVD view has been selected on the basis of the selected remote control key code and a current focus, overlays a corresponding OSD on the ACK signal, sends the overlaid OSD to a monitor output (S820) and simultaneously sends the ACK signal to the host device 100 (S830). Therefore, the host device 100 can output an OSD stored in the memory unit 140 on a screen (S840).

Then, the following automation process starts.

First, the wireless bridge 200 is switched to an external input of a DVD player connected through an AV cable (S841). Further, when a predetermined peripheral device (e.g., AV receiver) exists, the wireless bridge 200 sends a power-on control signal of the peripheral device to the corresponding peripheral device through the communication cable (S850). Then, the peripheral device is powered on by the control signal (S860) and sends a response signal containing information on an on-state of a power source to the wireless bridge 200 (S870).

Further, the wireless bridge 200 sequentially sends a control signal containing an external input switching command and a field effect command of the peripheral device to the corresponding peripheral device (S850) while confirming the state of the peripheral device through a control signal of checking the state of peripheral devices. Then, the peripheral device sends a response signal containing a switching result and a field effect state to the wireless bridge 200 (S870).

Next, the wireless bridge 200 sends a power-on control signal of the DVD player to the DVD player through a communication cable (S850) and the DVD player is powered on (S860). Further, the DVD player sends a response signal containing current state information to the wireless bridge 200 (S870).

Lastly, the wireless bridge 200 sends a control signal containing a DVD play command to the DVD player (S850) and the DVD player executes playback (S860) and sends a response signal containing information on the execution state to the wireless bridge 200 (S870).

When a normal setting has been completed (Y of S880), the wireless bridge 200 transmits the setting result to the host device 100 through an ACK signal (S890). Then, the host device 100 outputs a corresponding OSD on a screen and informs a user of the completion of the setting (S891).

Figure 21:
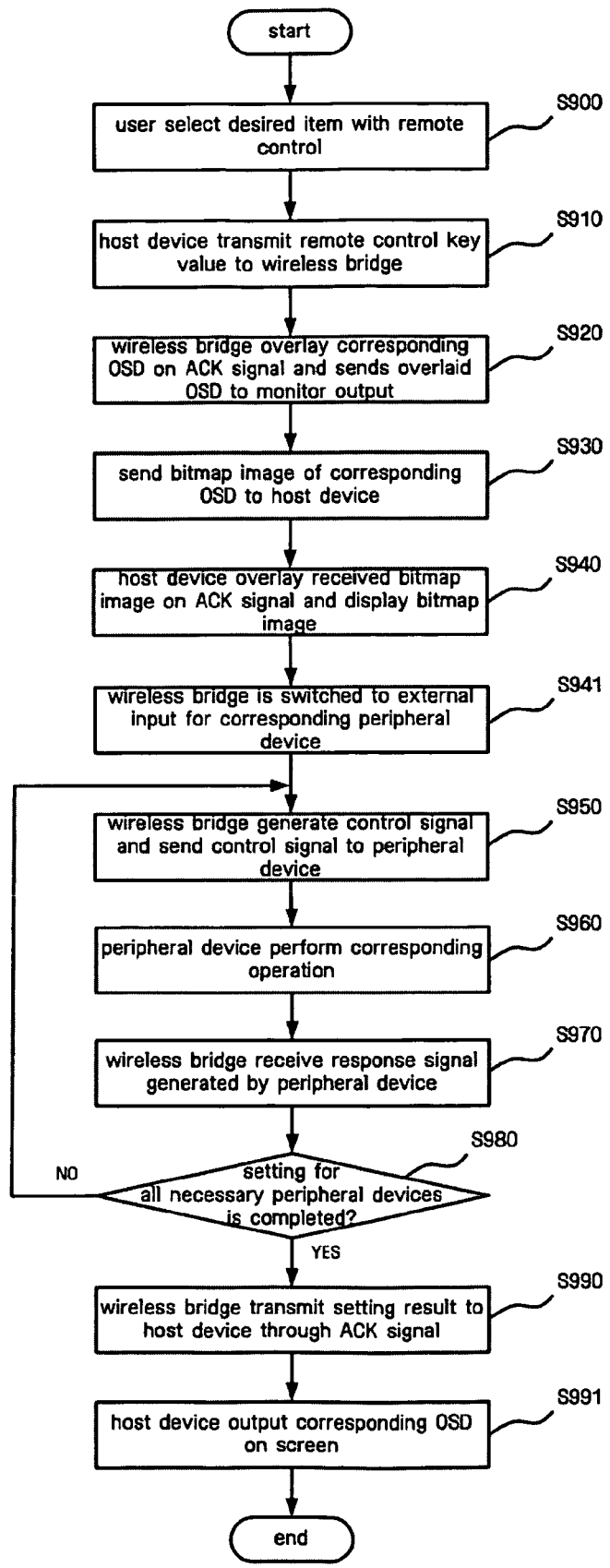
FIG. 21 is a flowchart illustrating an operation of the third embodiment in S40 of FIG. 10.

Hereinafter, a detailed operation according to the third embodiment will be described with reference to FIG. 21. In the third embodiment, only the wireless bridge 200 has an OSD bitmap. That is, when a user presses the automation menu button of the remote control, the host device 100 transmits a remote control key code corresponding to the automation menu button to the wireless bridge 200 through the control signal transceiver 122. The wireless bridge 200 having received the remote control key code overlays a OSD menu on an AV signal, sends the overlaid OSD menu to a monitor output and simultaneously transmits a corresponding OSD bitmap image to the host device 100. The host device 100 creates a OSD menu by means of the received bitmap image, overlays the OSD menu on a current ACK signal through the overlay unit 170, and displays the OSD menu on a screen.

When the user presses the direction key button of the remote control, the host device 100 sends a control signal containing a remote control key code corresponding to the direction key button to the wireless bridge 200. The wireless bridge 200 overlays the OSD menu having a changed focus according to the remote control key on the AV signal, sends the overlaid OSD menu to a monitor output and simultaneously sends a corresponding OSD bitmap image to the host device 100. Then, the host device 100 generates a OSD menu having a changed focus by means of the OSD bitmap image, overlays the OSD menu on the AV signal, and displays the overlaid OSD on the screen.

Herein, the host device 100 plays a role of retransmitting the remote control key code to the wireless bridge 200, overlaying the AV signal received in a wireless manner and the OSD bitmap image, and displaying overlaid OSD bitmap image on the screen.

Next, when the user selects a desired item (e.g., DVD view) on a menu (S900), the host device 100 transmits a remote control key code to the wireless bridge 200 (S910). The wireless bridge 200 recognizes that the DVD view has been selected on the basis of the received remote control key code and a current focus, overlays a corresponding OSD on the ACK signal, sends the overlaid OSD to a monitor output (S920).

Simultaneously, the wireless bridge 200 sends a bitmap signal containing a bitmap image to the host device 100 (S930). The host device 100 can output a corresponding OSD on the screen by means of the received bitmap image (S940).

Figure 20:
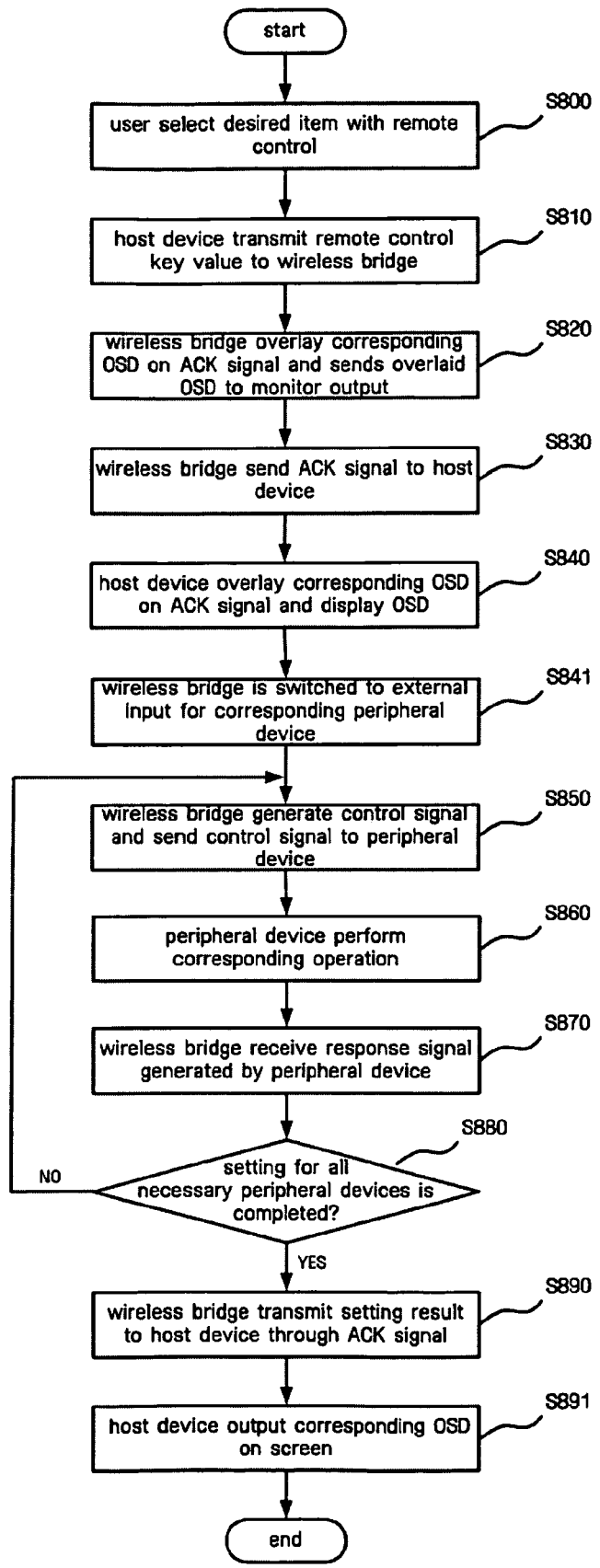
FIG. 20 is a flowchart illustrating an operation of the second embodiment in S40 of FIG. 10.

Since steps S941, S950, S960, S970, S980, S990, and S991 after step 940 are identical to S841, S850, S860, S870, S880, S890, and S891 after step 840 of FIG. 20, a description is omitted here.

In the descriptions of the first to the third embodiment, an interface between the host device 100 and a user is accomplished through the OSD menu as shown in FIG. 18, but the scope of the present invention is not limited to the OSD menu. That is, a remote control key code is allocated to each item of the OSD menu and only one remote control key is pressed, so that the peripheral devices 300 can simply perform a series of operations.

Meanwhile, as described above, in order to perform a control automation of the peripheral devices 300, the host device 100 or the wireless bridge 200 must assign IDs to the peripheral devices 300 currently connected through the device recognition and ID assignment process, the host device 100 must send a control signal for finding out connection states between the wireless bridge 200 and the peripheral devices 300, the host device 100 must receive a response signal for the control signal, and the host device 100 must store information on the connection states between the devices.

In a case in which the host device 100 becomes a subject of a connection setting, when a user selects a connection setting item, the host device 100 communicates with peripheral devices through the wireless bridge 200 by means of the communication protocol having the format of FIGS. 9A to 9D.

That is, while exchanging a control signal and a response signal with each peripheral device through the wireless bridge 200, the host device 100 finds out peripheral devices currently connected to the wireless bridge 200, stores the state of each device, and informs the user of the setting result through a proper OSD.

In a case in which the wireless bridge 200 becomes a subject of a connection setting, when a user selects a connection setting item, the host device 100 retransmits a remote control key code to the wireless bridge 200.

The wireless bridge 200 having analyzed the selected item on the basis of the remote control key code and a current OSD menu communicates with the peripheral devices 300 through communication cables by means of the communication protocol having the format of FIGS. 9A to 9D.

In this way, while exchanging a control signal and a response signal with each peripheral device through communication cables, the wireless bridge 200 finds out AV devices currently connected to the wireless bridge 200, and stores the state of each device.

Next, the wireless bridge 200 transmits the setting result to the host device 100 through an ACK signal, and the host device 100 informs the user of the result through a proper OSD. Further, the wireless bridge 200 transmits the setting result and a proper OSD bitmap image to the host device 100. Then, the host device 100 overlays the received OSD bitmap image on the AV signal, displays the overlaid OSD bitmap image, thereby informing the user of the result.

An AV system includes many devices having various functions according to the demands of users who wish to form entertainment environments from which users can feel the higher sense of enjoyment. In order to enable a predetermined operation to be performed in such an AV system, the users must perform a setting for each device one by one by using a corresponding remote control or by switching a mode according to each device of an integrated remote control. Further, even though an automatic setting using a macro can be performed, it cannot be ensured that a system setting is successfully completed.

According to the present invention, a video device and a peripheral device, etc., can be integrated and automated so that users can enjoy given entertainment environments while minimizing the inconveniences to the users and system malfunctions.

According to the present invention, radio environments between a peripheral device and a host device is constructed by means of the host device and a wireless bridge, thereby eliminating the limitation in installation of the host device and forming environments in which multiple host device can share and control peripheral devices.

According to the present invention, a user uses one remote control, thereby minimizing the number of times a button is depressed. Therefore, the user can automatically perform a setting for a desired series of operations.

The exemplary embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A method for controlling devices peripheral to an AV device comprising:
   a) detecting peripheral devices existing on a network and connected to the network through communication cables and allocating device identification IDs to respective peripheral devices;
   b) checking connection states of the peripheral devices by means of the allocated device identification IDs;
   c) receiving a remote control key code from a user through a remote control, generating control signals for controlling at least a first peripheral device of the peripheral devices, and transmitting the generated control signals to the at least the first peripheral device of the peripheral devices;
   d) transmitting a request requesting identification information of a second peripheral device of the peripheral devices to a third peripheral device of the peripheral devices;
   e) receiving a response for the request from a peripheral device having no device identification ID; and
   f) allocating a device identification ID to the peripheral device having transmitted the response.

2. The method as claimed in claim 1, further comprising receiving response signals comprising information on operation states according to the generated control signals, from the at least the first peripheral device of the peripheral devices having received the generated control signals.

3. The method as claimed in claim 1, wherein a) comprises:
   transmitting a request packet requesting inherent identification information of a second peripheral device of the peripheral devices to a third peripheral device of the peripheral devices connected to communicate with an AV device and the peripheral devices;
   receiving a response packet for the request packet from a predetermined peripheral device having no device identification ID; and
   allocating a device identification ID to the predetermined peripheral device having transmitted the response packet.

4. The method as claimed in claim 1, wherein a) comprises:
   receiving plug type information from respective peripheral devices to which the device identification IDs have been allocated;
   selecting a second peripheral device having an output terminal from among the peripheral devices through the received plug type information, setting an output signal of the selected second peripheral device to be in an on state, and setting an output signal of other peripheral devices to be in on states; and
   checking whether or not the output signal of the selected second peripheral device is inputted into a third peripheral device having an input terminal from among the other peripheral devices.

5. The method as claimed in claim 1, wherein the control signals are generated by a host device of an AV device side according to an input of the remote control key code by the user, and transmitted to a wireless bridge of a video device side wirelessly.

6. The method as claimed in claim 1, wherein a wireless bridge of a video device side having received the remote control key code inputted to a host device generates the control signals according to the remote control key code.

7. The method as claimed in claim 1, wherein the remote control key code is selected from a predetermined on screen display (OSD) menu generated by a host device of a video device side.

8. The method as claimed in claim 1, wherein:
the remote control key code is selected from a first predetermined on screen display (OSD) menu generated by a host device of a video device side; and,
when the wireless bridge of the video device side having received the remote control key code has generated a second OSD menu and sent an ACK signal to the host device, the host device having received the ACK signal generates a third OSD menu by means of a bitmap image stored in a memory unit of the host device.

9. The method as claimed in claim 1, wherein:
the remote control key code is selected from a first predetermined on screen display (OSD) menu generated by a host device of a video device side; and,
when the wireless bridge of the video device side having received the remote control key code has generated a second OSD menu and sent a bitmap image for generating the second OSD menu to the host device, the host device generates the second OSD menu by means of the bitmap image.

10. The method as claimed in claim 1, wherein a wireless bridge of a video device side codes and transmits an AV signal received from at least the first peripheral device of the peripheral device by a predetermined coding method, and a host device of the video device side decodes the coded AV signal received from the wireless bridge, thereby restoring the coded AV signal into voice and/or an image.

11. The method as claimed in claim 5, wherein the input of the remote control key code by the user is received wirelessly by the host device from a remote control.

12. The method as claimed in claim 6, wherein the input of the remote control key code by the user is received wirelessly by the host device from a remote control.

13. The method as claimed in claim 11, wherein the remote control is separate from the host device.

14. The method as claimed in claim 12, wherein the remote control is separate from the host device.

15. The method as claimed in claim 1, wherein a) comprises:
receiving plug information from respective peripheral devices to which the device identification IDs have been allocated;
selecting a second peripheral device having an terminal from among the peripheral devices through the received plug information, setting a signal of the selected second peripheral device to be in an on state, and setting a signal of other peripheral devices to be in on states; and
checking whether or not the signal of the selected second peripheral device is inputted into a third peripheral device having an terminal from among the other peripheral devices.

* * * * *